US012757616B2

(12) United States Patent
Lee et al.

(10) Patent No.: US 12,757,616 B2
(45) Date of Patent: Oct. 6, 2026

(54) DISPLAY DEVICE

(71) Applicant: Samsung Display Co., LTD., Yongin-si (KR)

(72) Inventors: Sangduk Lee, Yongin-si (KR); Hoikwan Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 367 days.

(21) Appl. No.: 18/604,081

(22) Filed: Mar. 13, 2024

(65) Prior Publication Data

US 2024/0397791 A1 Nov. 28, 2024

(30) Foreign Application Priority Data

May 25, 2023 (KR) ........................ 10-2023-0067327

(51) Int. Cl.

| | |
|---|---|
| ***H10K 59/80*** | (2023.01) |
| ***H10K 77/10*** | (2023.01) |
| *H10K 71/40* | (2023.01) |
| *H10K 102/00* | (2023.01) |

(52) U.S. Cl.

CPC ....... *H10K 59/873* (2023.02); *H10K 59/8791* (2023.02); *H10K 77/111* (2023.02); *H10K 71/421* (2023.02); *H10K 2102/311* (2023.02)

(58) Field of Classification Search

None

See application file for complete search history.

(56) References Cited

U.S. PATENT DOCUMENTS

| | | | | |
|---|---|---|---|---|
| 9,526,166 | B2 | 12/2016 | Jin et al. | |
| 10,290,685 | B2 | 5/2019 | Oh et al. | |
| 10,446,769 | B2 * | 10/2019 | Kim | H10K 77/111 |
| 10,868,088 | B2 | 12/2020 | Bok et al. | |
| 11,183,653 | B2 * | 11/2021 | Lee | H10K 50/87 |
| 11,380,868 | B2 * | 7/2022 | Qi | H10K 59/873 |
| 11,468,832 | B2 * | 10/2022 | Zhu | H10D 86/411 |
| 2018/0182829 | A1 * | 6/2018 | Shin | G06F 1/1652 |
| 2019/0165332 | A1 * | 5/2019 | Kwon | H10K 59/88 |

(Continued)

FOREIGN PATENT DOCUMENTS

| | | |
|---|---|---|
| CN | 111524944 A | 8/2020 |
| KR | 100129499 B1 | 4/1998 |

(Continued)

*Primary Examiner* — Robert E. Tallman

(74) *Attorney, Agent, or Firm* — CANTOR COLBURN LLP

(57) ABSTRACT

A display device includes a display panel including a non-bending area and a bending area, a bending protection layer disposed on the display panel and bent together with the bending area, a polarization unit disposed on the display panel, overlapping the non-bending area, where a step is defined on an upper surface of the polarization unit, a light shielding film adhered to one area of the bending protection layer and the step and covering a bent portion of the display panel in a plan view, where the light shielding film is a rigid board, and a coating window disposed directly on the polarization unit and the light shielding film and including a material cured by laser irradiation. The step has a shape corresponding to the light shielding film, and a side surface of the light shielding film is in contact with the step on a cross section.

20 Claims, 38 Drawing Sheets

(56) References Cited

U.S. PATENT DOCUMENTS

| | | | | |
|---|---|---|---|---|
| 2019/0245157 | A1* | 8/2019 | Chung | H10K 59/124 |
| 2023/0015124 | A1* | 1/2023 | Ryu | G02F 1/0147 |
| 2023/0157064 | A1* | 5/2023 | Zhu | H10K 77/111 257/40 |
| 2024/0215199 | A1* | 6/2024 | Zhang | H05K 7/20272 |

FOREIGN PATENT DOCUMENTS

| | | | |
|---|---|---|---|
| KR | 1020170132398 | A | 12/2017 |
| KR | 102043692 | B1 | 11/2019 |
| KR | 1020200102025 | A | 8/2020 |

* cited by examiner

DISPLAY DEVICE

This application claims priority to Korean Patent Application No. 10-2023-0067327, filed on May 25, 2023, and all the benefits accruing therefrom under 35 U.S.C. § 119, the content of which in its entirety is herein incorporated by reference.

BACKGROUND

1. Field

Embodiments of the disclosure described herein relate to a display device, and more particularly, to a display device including a coating window.

2. Description of the Related Art

Display devices such as televisions, monitors, smart phones, and tablet personal computers (PCs) that provide images to users include display panels that display images. Various types of display panel such as liquid crystal display panels, organic light emitting display panels, electro wetting display panels, and electrophoretic display panels have been developed as the display panels. Further, the display device may include a window for protecting the display panel. The window may be attached to the display panel through a lamination process.

SUMMARY

Embodiments of the disclosure provide a display device including a coating window.

According to an embodiment, a display device includes a display panel including a non-bending area and a bending area extending and bent from the non-bending area, a bending protection layer disposed on the display panel and bent together with the bending area, a polarization unit disposed on the display panel, overlapping the non-bending area, where a step is defined on an upper surface of the polarization unit, a light shielding film adhered to one area of the bending protection layer and the step and covering a bent portion of the display panel in a plan view, where the light shielding film is a rigid board, and a coating window disposed directly on the polarization unit and the light shielding film and including a material cured by laser irradiation, where the step has a shape corresponding to the light shielding film, and a side surface of the light shielding film is in contact with the step on a cross section.

In an embodiment, the polarization unit may include a first polarization part having a first thickness and a second polarization part extending from the first polarization part and having a second thickness less than the first thickness.

In an embodiment, a distance from an upper surface of the second polarization part to a lower surface of the display panel may be substantially the same as a distance from an upper surface of the bending protection layer to the lower surface of the display panel.

In an embodiment, the coating window may be disposed directly on an upper surface of the first polarization part, and the light shielding film may be adhered onto an upper surface of the second polarization part.

In an embodiment, an upper surface of the light shielding film and the upper surface of the polarization unit may be aligned with each other on the cross section.

In an embodiment, a lower surface of the light shielding film may be adhered to the one area of the bending protection layer by an adhesive layer.

In an embodiment, the lower surface of the light shielding film may be detachably adhered onto the one area of the bending protection layer.

In an embodiment, an outer surface of the light shielding film and an outer surface of the coating window may be aligned with each other on the cross section.

In an embodiment, an outer surface of the light shielding film may protrude outward beyond a point of a bent portion of the bending protection layer, which is most distant from the non-bending area.

According to an embodiment, a display device includes a display panel including a non-bending area and a bending area extending and bent from the non-bending area, a polarization unit disposed on the display panel and overlapping the non-bending area, an auxiliary film disposed to overlap the bending area in a plan view, where the auxiliary film has a side surface in contact with an outer surface of the polarization unit and an upper surface extending from an upper surface of the polarization unit, a light shielding pattern disposed on directly the auxiliary film and the polarization unit and overlapping the bending area in the plan view, and a coating window disposed directly on the light shielding pattern and the polarization unit and including a resin material, where a distance from the upper surface of the auxiliary film to a lower surface of the display panel is substantially the same as a distance from the upper surface of the polarization unit to the lower surface of the display panel.

In an embodiment, the display device may further include a bending protection layer disposed between the display panel and the auxiliary film and bent together with the bending area, where an upper surface of the bending protection layer and a lower surface of the auxiliary film may be adhered to each other by an adhesive layer.

In an embodiment, the lower surface of the auxiliary film and the upper surface of the bending protection layer may be detachably adhered to each other.

In an embodiment, an outer surface of the light shielding pattern may protrude outward beyond a point of a bent portion of the bending protection layer, which is most distant from the non-bending area.

In an embodiment, the auxiliary film may be adhered to an upper surface of the display panel and may be bent together with the bending area.

In an embodiment, a portion of the upper surface of the auxiliary film, which corresponds to the light shielding pattern, may be coated with a release agent.

In an embodiment, a sum of a thickness of the auxiliary film and a thickness of the release agent may be substantially the same as a thickness of the polarization unit.

In an embodiment, an outer surface of the light shielding pattern may protrude outward beyond a point of a bent portion of the auxiliary film, which is most distant from the non-bending area.

According to an embodiment, a display device includes a display panel including a non-bending area and a bending area extending and bent from the non-bending area, a polarization unit disposed on the display panel, bent together with the bending area, and including an upper surface coated with a release agent, a light shielding pattern disposed directly on the release agent coated on the upper surface and covering a bent portion of the display panel in a plan view, and a coating window disposed directly on the light shielding pattern and the polarization unit and including a resin material.

In an embodiment, the release agent may be coated at only a portion of the upper surface of the polarization unit, which corresponds to the light shielding pattern.

In an embodiment, an outer surface of the light shielding pattern may protrude outward beyond a point of a bent portion of the polarization unit, which is most distant from the non-bending area.

BRIEF DESCRIPTION OF THE DRAWINGS

The above and other features of embodiments of the disclosure will become apparent by describing in detail embodiments thereof with reference to the accompanying drawings.

DETAILED DESCRIPTION

Figure 1:
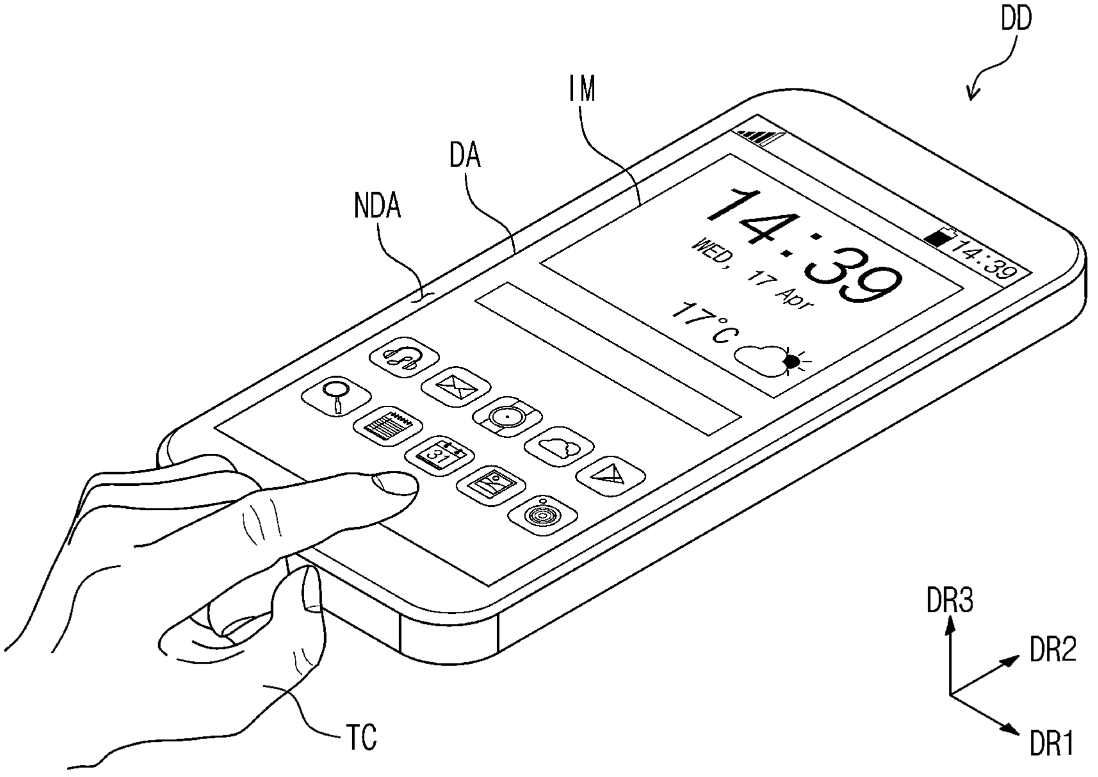
FIG. 1 is a perspective view of a display device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the specification, the expression that a first component (or area, layer, part, portion, etc.) is "on", "connected with", or "coupled to" a second component means that the first component is directly on, connected with, or coupled to the second component or means that a third component is interposed therebetween.

The same reference numerals refer to the same components. Further, in the drawings, the thickness, the ratio, and the dimension of components are exaggerated for effective description of technical contents.

Although the terms "first", "second", etc. may be used to describe various components, the components should not be limited by the terms. The terms are only used to distinguish one component from another component. For example, without departing from the right scope of the disclosure, a first component may be referred to as a second component, and similarly, the second component may be also referred to as the first component.

Also, the terms "under", "below", "on", "above", etc. are used to describe the correlation of components illustrated in drawings. The terms that are relative in concept are described based on a direction illustrated in drawings.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. Thus, reference to "an" element in a claim followed by reference to "the" element is inclusive of one element and a plurality of the elements. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to accompanying drawings.

FIG. 1 is a perspective view of a display device DD according to an embodiment of the disclosure.

Referring to FIG. 1, an embodiment where the display device DD is implemented as a portable terminal is illustrated as an example. The portable terminal may include a tablet personal computer (PC), a smart phone, a personal digital assistant (PDA), a portable multimedia player (PMP), a game console, a wrist watch-type electronic device, or the like. However, the disclosure is not limited thereto.

The display device DD according to an embodiment of the disclosure may be used in large-sized electronic apparatuses such as a television and an external billboard as well as small-to-medium sized electronic apparatus such as the PC, a laptop computer, a vehicle navigation unit, and a camera. These are merely presented as an embodiment and may be employed to other types of electronic device as long as the display devices do not deviate from the concept of the disclosure.

The display device DD may be flexible. The term "flexible" may mean having a property that may be bent and including both a structure that is completely folded and a structure that may be bent by several nanometers. For example, the flexible display device DD may include a curved display device, a foldable display device, a slidable display device, or a rollable display device. However, the disclosure is not limited thereto, and the display device DD may be rigid.

In an embodiment, as illustrated in FIG. 1, a display surface on which an image IM is displayed is parallel to a plane defined by a first direction DR1 and a second direction DR2. The display device DD includes a plurality of areas divided on the display surface. The display surface includes a display area DA on which the image IM is displayed and a non-display area NDA adjacent to the display area DA. The non-display area NDA may be referred to as a bezel area. In an embodiment, for example, the display area DA may have a quadrangular shape. The non-display area NDA surrounds the display area DA. Further, although not illustrated, in an alternative embodiment, the display device DD may include a partially curved shape. In such an embodiment, one area of the display area DA may have a curved shape.

A front surface (or an upper surface) and a rear surface (or a lower surface) of each of members constituting the display device DD may be opposite to each other in a third direction DR3, and a normal direction of each of the front surface and the rear surface may be substantially parallel to the third direction DR3. A separation distance between the front surface and the rear surface defined in the third direction DR3 may correspond to a thickness of a member (or a unit). In the specification, the term "on a plan view" may be defined as a state viewed in the third direction DR3. In the specification, the term "on a cross section" may be defined as a state viewed in the first direction DR1 or the second direction DR2. However, it would be understood that directions indicated by the first to third directions DR1, DR2, and DR3 are relative concepts and may be changed to other directions. In the specification, the term "overlap" may refer to a state of overlapping in a plan view or in the third direction DR3 unless otherwise defined.

The front surface (or the upper surface or a first surface) and the rear surface (or the lower surface or a second surface) of each of the members are defined based on a direction in which the image IM is displayed. However, it would be understood that the directions indicated by the first to third directions DR1, DR2, and DR3 are relative concepts and may be changed to other directions. Hereinafter, the first to third directions refer to the directions indicated by the first to third directions DR1, DR2, and DR3 shown in FIG. 1, respectively.

The display device DD according to an embodiment of the disclosure may detect a touch input TC of a user, which is applied from the outside. The touch input TC of the user includes various types of external inputs such as a portion of a body of the user, a light beam, heat or pressure. In an embodiment, the input of the user may be a hand of the user applied to the front surface, but this is illustrative, and as described above, the touch input TC of the user may be provided in various forms. Further, the display device DD may detect the input of the user applied to a side surface or a rear surface of the display device DD according to a structure of the display device DD, and the disclosure is not limited to an embodiment.

Figure 2:
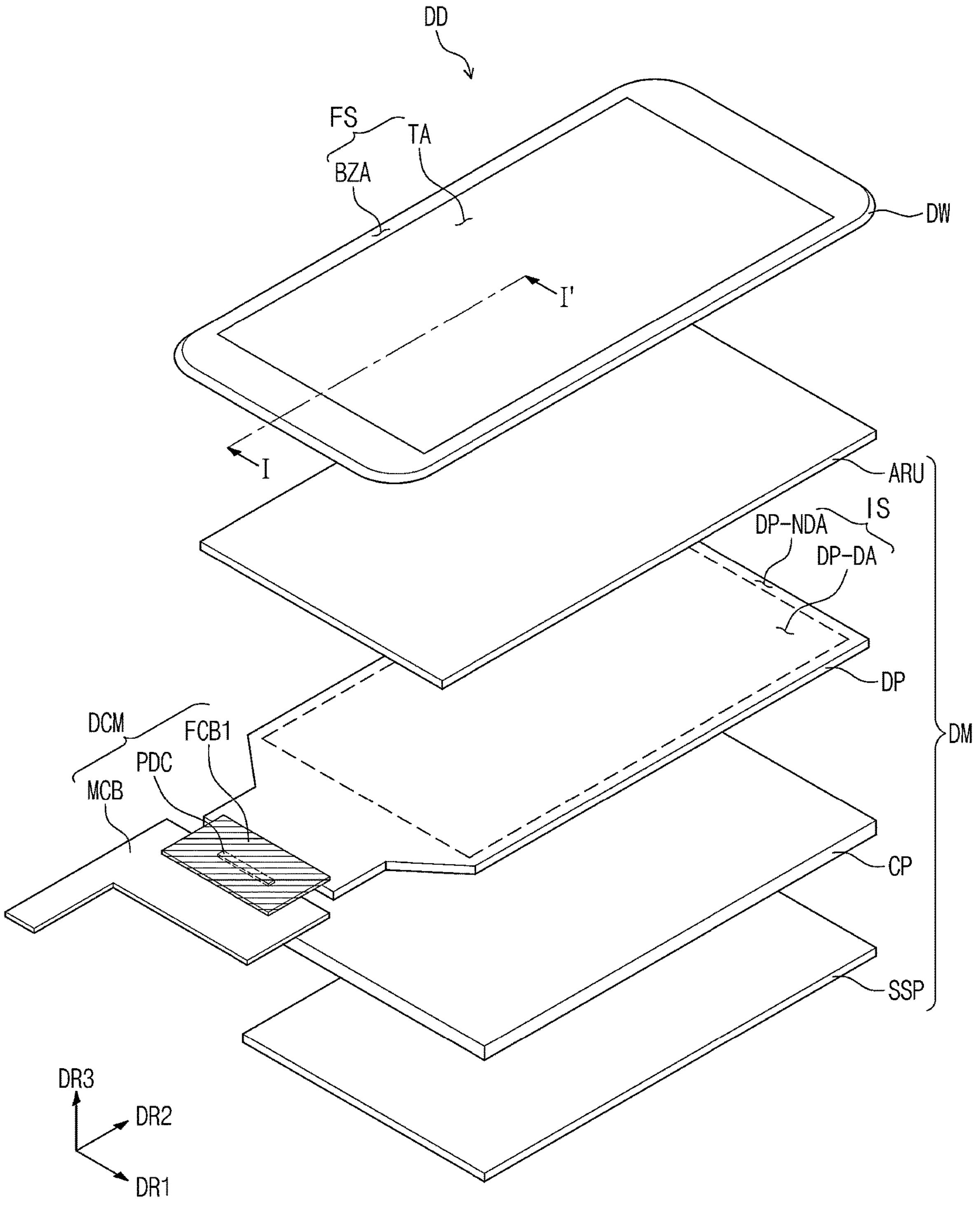
FIG. 2 is an exploded perspective view of the display device according to an embodiment of the disclosure.

FIG. 2 is an exploded perspective view of the display device DD according to an embodiment of the disclosure.

Referring to FIG. 2, an embodiment of the display device DD may include a coating window DW and a display module DM. The coating window DW may be directly disposed on a polarization unit ARU. Here, the term "directly disposed" may refer to a state of being disposed without a separate adhesive or a separate adhesive layer.

The coating window DW may provide a front surface FS of the display device DD. The front surface FS of the coating window DW may include a transmissive area TA and the bezel area BZA. The transmissive area TA of the coating window DW may be an optically transparent area. The coating window DW may transmit the image IM provided by a display panel DP through the transmissive area TA, and the user may visually recognize the corresponding image IM (see FIG. 1).

The bezel area BZA of the coating window DW may overlap a light shielding pattern BM (see FIG. 4) or a light shielding film BMF (see FIGS. 5A and 5B), which will be described below. The light shielding film BMF (see FIGS. 5A and 5B) may be a rigid film including a material including a predetermined color. The light shielding pattern BM (see FIG. 4) may be formed through a process of applying a coating solution including a light shielding material and curing the applied coating solution. The bezel area BZA of the coating window DW may prevent one component of the display panel DP disposed to overlap the light shielding pattern BM (see FIG. 4) or the light shielding film BMF (see FIGS. 5A and 5B) from being visually recognized from the outside.

The bezel area BZA may be adjacent to the transmissive area TA. A shape of the transmissive area TA may be substantially defined by the bezel area BZA. In an embodiment, for example, the bezel area BZA may be disposed outside the transmissive area TA and surround the transmissive area TA. However, this is illustrative, and the bezel area BZA may be adjacent to only one side of the transmissive area TA or omitted. Further, the bezel area BZA also may be disposed not on the front surface FS but on a side surface of the display device DD.

The coating window DW may include an optically transparent insulating material. The coating window DW may include a resin material. The coating window DW may include a material cured by laser irradiation. The coating window DW may be generated by a process of applying the resin material and a process of curing the applied resin material by radiating a light beam such as ultraviolet rays thereto. The coating window DW may have a single-layer structure or a multi-layer structure. In an embodiment of the display device DD including the coating window DW according to the disclosure, a lamination process is omitted, and thus a process of manufacturing the display device DD may be simplified and costs may be reduced.

The coating window DW may include a functional coating layer such as an anti-fingerprint layer, an anti-reflective layer, and a hard coating layer. In an embodiment, a portion of the coating window DW overlapping a display area DP-DA may have a flat shape, but the shape of the coating window DW may be variously modified. Edges of the coating window DW facing each other in the first direction DR1 also may be provided as curved surfaces.

The display module DM may be disposed on a rear surface of the coating window DW to generate an image. Further, the display module DM may detect the touch input TC (see FIG. 1) of the user.

In an embodiment, the display module DM providing a flat display surface is illustratively illustrated, but the shape of the display module DM may be modified. Edges of the display module DM facing each other in the first direction DR1 may be bent from central portions thereof to provide a curved surface.

The display module DM may include the polarization unit ARU, the display panel DP, a protective panel CP, a support panel SSP, and a driving control module DCM.

The polarization unit ARU may be disposed on the display panel DP. The polarization unit ARU may be a polarization film, a polarization filter, or a polarization plate. The polarization unit ARU may be disposed between the coating window DW and the display panel DP. The polarization unit ARU may reduce a reflectance of a light beam input from the outside. The polarization unit ARU may be attached to the display panel DP through an adhesive layer.

The display panel DP may be disposed between the coating window DW and the support panel SSP. The display panel DP may display an image in response to an electrical signal. The display panel DP according to an embodiment may be a light emitting display panel, but the disclosure is not particularly limited thereto. In an embodiment, for example, the display panel DP may be an organic light emitting display panel, an inorganic light emitting display panel, an organic-inorganic light emitting display panel, or a quantum dot light emitting display panel. A light emitting layer of the organic light emitting display panel may include an organic light emitting material, and a light emitting layer of the inorganic light emitting display panel may include an inorganic light emitting material. A light emitting layer of the organic-inorganic light emitting display panel may include an organic-inorganic light emitting material. A light emitting layer of the quantum dot light emitting display panel may include a quantum dot and a quantum rod.

The image IM (see FIG. 1) provided by the display device DD may be disposed on a front surface IS of the display panel DP. The front surface IS of the display panel DP may include the display area DP-DA and a non-display area DP-NDA. Here, the display area DP-DA may correspond to the display area DA of FIG. 1, and the non-display area DP-NDA may correspond to the non-display area NDA of FIG. 1.

The display area DP-DA may be an area that is activated based on an electrical signal and displays an image. According to an embodiment, the display area DP-DA of the display panel DP may correspond to the transmissive area TA of the coating window DW. In the specification, the t "area/portion corresponds to area/portion" refers to a state of "overlapping each other", and is not limited to a state of having a same area and/or a same shape as each other.

The non-display area DP-NDA may be adjacent to an outer side of the display area DP-DA. In an embodiment, for example, the non-display area DP-NDA may surround the display area DP-DA. However, the disclosure is not limited thereto, and the non-display area DP-NDA may be defined in various shapes.

The non-display area DP-NDA may be an area in which a driving circuit or driving line for driving elements arranged in the display area DP-DA, various signal lines for providing electrical signals, pads, and the like are arranged. The non-display area DP-NDA of the display panel DP may correspond to the bezel area BZA of the coating window DW. Components of the display panel DP, which are arranged in the non-display area DP-NDA, may be effectively prevented from being visually recognized from the outside by the bezel area BZA.

The driving control module DCM includes a main circuit board MCB (or a driving circuit board), a first circuit board FCB1 (or a panel flexible circuit board), and a panel driving circuit PDC. The first circuit board FCB1 may be connected to the distal end of the display panel DP to electrically connect the main circuit board MCB and the display panel DP.

The first circuit board FCB1 may electrically connect the main circuit board MCB and the display panel DP, and the panel driving circuit PDC may be mounted on the first circuit board FCB1. The panel driving circuit PDC may be implemented as an integrated circuit. Although not separately illustrated, a plurality of passive elements and a plurality of active elements may be mounted on the main circuit board MCB. The main circuit board MCB may be a rigid circuit board or a flexible circuit board, and the first circuit board FCB1 may be a flexible circuit board.

The protective panel CP may be disposed on the rear surface of the display panel DP to protect the display panel DP from an impact. The protective panel CP may include a plastic film as a base layer. The protective panel CP may have a single-layer structure or a multi-layer structure.

The support panel SSP may be disposed on a rear surface of the protective panel CP to support the display panel DP and the protective panel CP. The support panel SSP may be a metal plate having a rigidity greater than or equal to a standard. In an embodiment, for example, the support panel SSP may be a stainless steel plate. The support panel SSP may have a black color to shield an external light beam input to the display panel DP.

Figure 3:
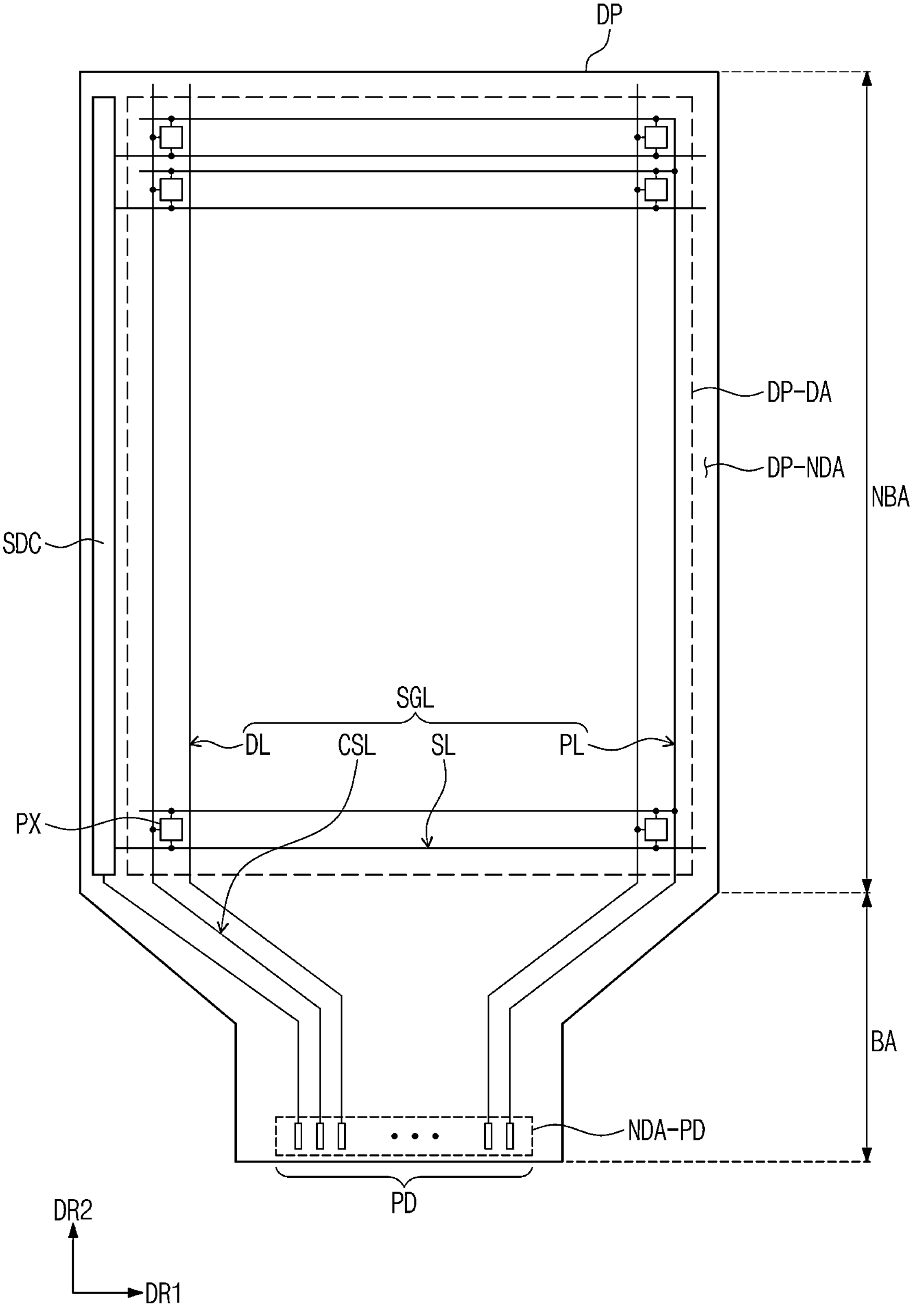
FIG. 3 is a plan view of a display panel according to an embodiment of the disclosure.

FIG. 3 is a plan view of the display panel DP according to an embodiment of the disclosure.

FIG. 3 is a plan view of the display panel DP according to an embodiment of the disclosure. FIG. 3 schematically illustrates a signal circuit diagram. Further, in FIG. 3, for convenience of illustration and description, some components are omitted.

In an embodiment, as illustrated in FIG. 3, the display panel DP may include the display area DP-DA and the non-display area DP-NDA in a plan view. In an embodiment, the non-display area DP-NDA may be defined along an edge of the display area DP-DA. The display area DP-DA and the non-display area DP-NDA of the display panel DP correspond to the display area DA and the non-display area NDA of the display device DD illustrated in FIG. 1, respectively.

The display panel DP may include a non-bending area NBA and a bending area BA extending and bent from a distal end of the non-bending area NBA. As illustrated in FIG. 3, in the second direction DR2, the non-bending area NBA may be positioned on an upper side, and the bending area BA may be positioned on a lower side. A lower distal end of the bending area BA may be bent and disposed to face or overlap the non-bending area NBA.

The display panel DP may include a scan driving circuit SDC, a plurality of signal lines SGL (hereinafter, referred to as signal lines), a plurality of signal pads PD (hereinafter, referred to as signal pads), and a plurality of pixels PX (hereinafter, referred to as pixels). The pixels PX are arranged in the display area DP-DA. Each of the pixels PX includes an organic light emitting diode and a pixel driving circuit connected thereto.

The scan driving circuit SDC generates a plurality of scan signals (hereinafter, scan signals) and sequentially outputs the scan signals to a plurality of scan lines SL (hereinafter, referred to as scan lines), which will be described below. The scan driving circuit SDC may further output another control signal to driving circuits of the pixels PX.

The scan driving circuit SDC may include a plurality of thin film transistors formed through a same process as that of the driving circuits of the pixels PX, for example, a low temperature polycrystaline silicon (LTPS) process or a low temperature polycrystalline oxide (LTPO) process.

The signal lines SGL include the scan lines SL, data lines DL, a power line PL, and a control signal line CSL. The scan lines SL are respectively connected to corresponding pixels PX among the pixels PX, and the data lines DL are respectively connected to corresponding pixels PX among the pixels PX. The power line PL is connected to the pixels PX. The control signal line CSL may provide control signals to the scan driving circuit SDC.

The signal lines SGL overlap the display area DP-DA and the non-display area DP-NDA. The signal lines SGL may include a pad part and a line part. The line part overlaps the display area DP-DA and the non-display area DP-NDA. The pad part is connected to a distal end of the line part. The pad part is disposed on the non-display area DP-NDA and overlaps a corresponding signal pad among the signal pads PD. An area of the non-display area DP-NDA, in which the signal pads PD are arranged, may be defined as a pad area NDA-PD.

The line part substantially connected to the pixel PX constitutes most of the signal lines SGL. The line part is connected to transistors (not illustrated) of the pixel PX. The line part may have a single-layer/multi-layer structure, and the line part may be a single body or may include two or more parts. The two or more parts may be arranged on different layers and connected to each other via a contact hole defined through an insulating layer disposed between the two or more parts.

Figure 4:
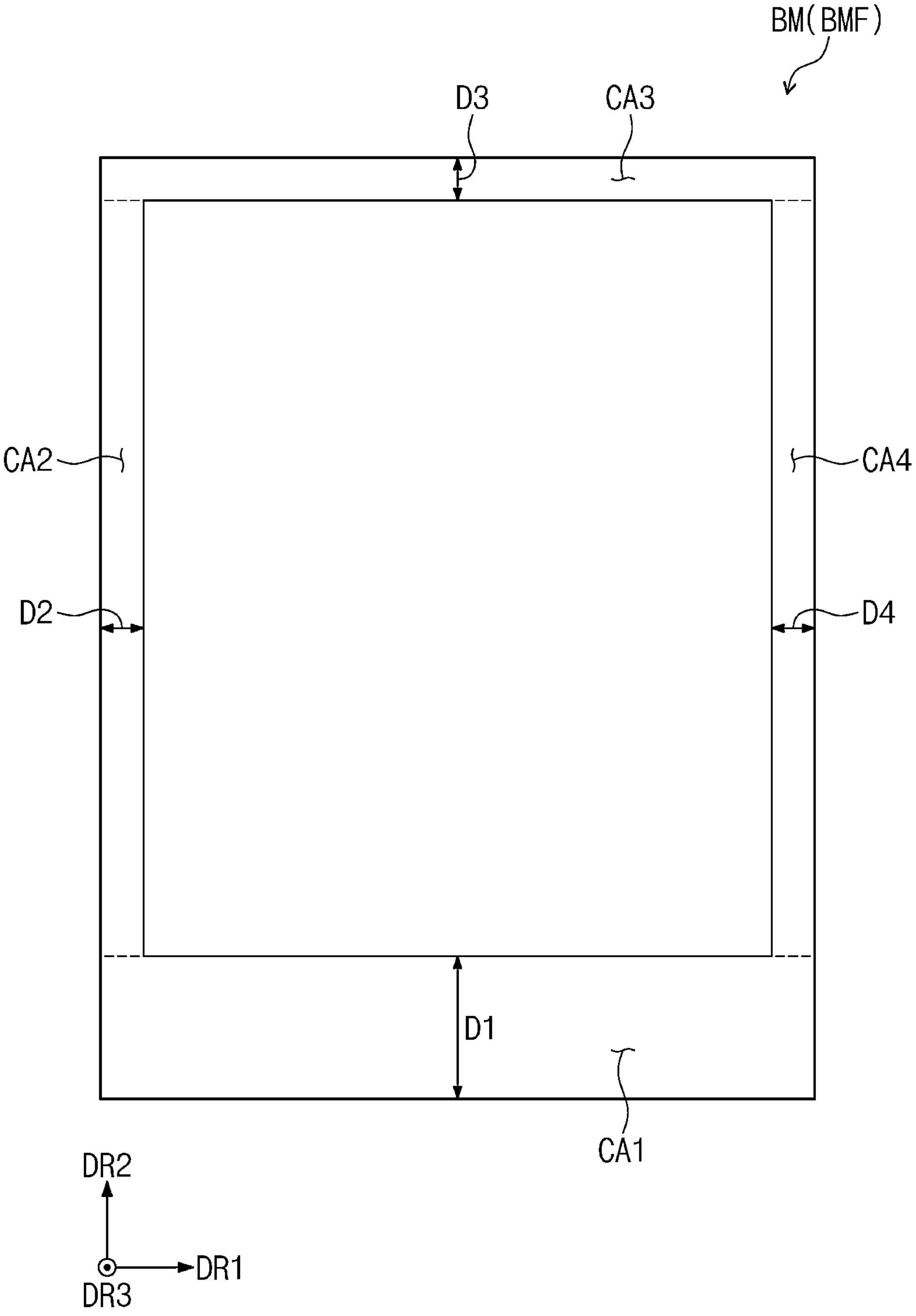
FIG. 4 is a plan view of a light shielding pattern or a light shielding film according to an embodiment of the disclosure.

FIG. 4 is a plan view of a light shielding pattern BM or a light shielding film BMF according to an embodiment of the disclosure.

Referring to FIGS. 3 and 4, in an embodiment, the light shielding pattern BM or the light shielding film BMF includes a light shielding material and thus may effectively prevent a component disposed below the light shielding pattern BM or the light shielding film BMF from being visually recognized from the outside. The light shielding pattern BM may include a black resin that does not transmit a light beam. The light shielding film BMF may be a black rigid board that does not transmit light beam. The light shielding pattern BM or the light shielding film BMF may be arranged to overlap the non-display area DP-NDA of the display panel DP. The light shielding pattern BM or the light shielding film BMF may be arranged to overlap the bezel area BZA (see FIG. 2) of the coating window DW (see FIG. 2).

The light shielding pattern BM or the light shielding film BMF may include a first light shielding part CA1, a second light shielding part CA2, a third light shielding part CA3, and a fourth light shielding part CA4. The first light shielding part CA1 may be an area adjacent to the pad area NDA-PD, in which the signal pads PD are arranged, in the non-display area DP-NDA of the display panel DP. The first light shielding part CA1 may be disposed adjacent to a lower side of the non-bending area NBA in a plan view.

The second light shielding part CA2 may extend from the first light shielding part CA1 in the second direction DR2 from in a plan view. The second light shielding part CA2 may be disposed adjacent to a left side of the non-bending area NBA in a plan view.

The third light shielding part CA3 may extend from the second light shielding part CA2 in the first direction DR1. The third light shielding part CA3 may face the first light shielding part CA1 in a plan view. The third light shielding part CA3 may be disposed adjacent to an upper side of the non-bending area NBA in a plan view. The third light shielding part CA3 and the first light shielding part CA1 may be spaced apart from each other in the second direction DR2.

The fourth light shielding part CA4 may extend from the third light shielding part CA3 in an opposite direction to the second direction DR2. The fourth light shielding part CA4 may face the second light shielding part CA2 in a plan view. The fourth light shielding part CA4 may be disposed adjacent to a right side of the non-bending area NBA in a plan view. The fourth light shielding part CA4 and the second light shielding part CA2 may be spaced apart from each other in the first direction DR1.

Each of widths D2, D3, and D4 of the second light shielding part CA2, the third light shielding part CA3, and the fourth light shielding part CA4 may be less than a first width D1 of the first light shielding part CA1. In an embodiment, for example, the first width D1 of the first light shielding part CA1 may be about 2 micrometers (mm) or greater, and the second to fourth widths D2, D3, and D4 of the second light shielding part CA2, the third light shielding part CA3, and the fourth light shielding part CA4 may be about 1.5 mm.

Figure 5A:
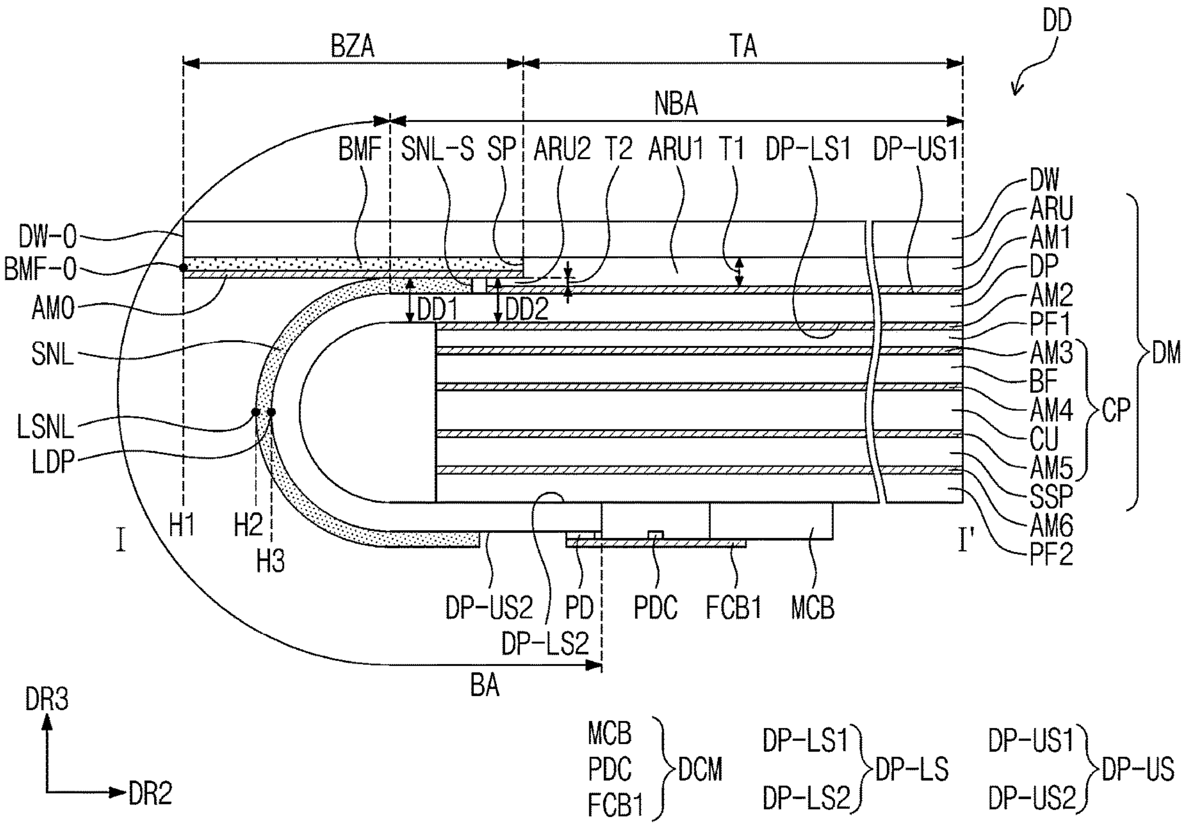
FIG. 5A is a cross-sectional view of the display device according to an embodiment of the disclosure.

FIG. 5A is a cross-sectional view of the display device DD according to an embodiment of the disclosure. In more detail, FIG. 5A is a cross-sectional view along line I-I' of FIG. 2.

Although the display panel DP is illustrated as a single layer in FIG. 5A for convenience of illustration, an embodiment of the display panel DP may have a multi-layer structure. The display panel DP may include a base layer, a circuit layer, a light emitting element layer, and an encapsulation layer. In addition, those skilled in the art would understand that other general-purpose components may be further included in the display panel DP.

Referring to FIG. 5A, an embodiment of the display device DD may have a laminate structure. The display device DD may include the display module DM and the coating window DW directly disposed on the display module DM. The display module DM may include the display panel DP, the polarization unit ARU, a first protective film PF1, a second protective film PF2, the protective panel CP, the support panel SSP, and first to sixth adhesive layers AM1 to AM6.

The first to sixth adhesive layers AM1 to AM6, which will be described below, may be a pressure sensitive adhesive (PSA) film, an optically clear adhesive (OCA) film, or an optically clear resin (OCR). The first to sixth adhesive layers AM1 to AM6 include a photo-curable adhesive material or a heat-curable adhesive material, but the material thereof is not particularly limited. Alternatively, some of the first to sixth adhesive layers AM1 to AM6 may be omitted.

In an embodiment, the display panel DP may be bent and a bent portion of the display panel DP may be dispose below the support panel SSP. One surface of the second protective film PF2 may be adhered to the sixth adhesive layer AM6. A first upper surface DP-US1 of the display panel DP, which is not bent, may be closer to the coating window DW than a first rear surface DP-LS1. A second upper surface DP-US2 of the display panel DP, which is bent, may be farther away from the coating window DW than a second lower surface DP-LS2 is. In such an embodiment, a bending protection layer SNL disposed on the display panel DP may also be bent together with the display panel DP. The bending protection layer SNL may prevent the bent display panel DP from being exposed to the outside and thus protect the bending area BA of the display panel DP.

The polarization unit ARU may be disposed on an upper surface DP-US of the display panel DP. The polarization unit ARU may overlap the non-bending area NBA of the display panel DP. The polarization unit ARU may serve as a base layer when the resin material such as a resin for forming the coating window DW is applied. Further, the polarization unit ARU may serve as a barrier that prevents the coating solution of the coating window DW from invading or flowing into the display panel DP.

A step (or a step structure) SP may be defined on an upper surface of the polarization unit ARU. The step SP of the polarization unit ARU may have a shape corresponding to a shape thereof overlapping the light shielding film BMF. The polarization unit ARU may include a first polarization part ARU1 and a second polarization part ARU2 extending from the first polarization part ARU1. A thickness of the first polarization part ARU1 may be a first thickness T1. The second polarization part ARU2 may be a part extending from the first polarization part ARU1 in an outward direction that is an opposite direction to the second direction DR2. A thickness of the second polarization part ARU2 may be a second thickness T2 that is less than the first thickness T1. The step SP may be defined at a boundary between the first polarization part ARU1 and the second polarization part ARU2.

A lower surface of the first polarization part ARU1 and a lower surface of the second polarization part ARU2 may constitute a same surface. The coating window DW may be directly disposed on an upper surface of the first polarization part ARU1. The light shielding film BMF may be adhered to an upper surface of the second polarization part ARU2.

A distance DD2 from the upper surface of the second polarization part ARU2 to a lower surface of the display panel DP may be substantially the same as a distance DD1 from an upper surface of the bending protection layer SNL to the lower surface of the display panel DP. That is, the upper surface of the second polarization part ARU2 and the upper surface of the bending protection layer SNL may have a same position in the third direction DR3 (or be on a same level). Accordingly, when the light shielding film BMF is adhered to the upper surface of the second polarization part ARU2 and the upper surface of the bending protection layer SNL, the light shielding film BMF may be stably seated.

The first polarization part ARU1 and the second polarization part ARU2 may be adhered to the display panel DP by the first adhesive layer AM1. Alternatively, the first adhesive layer AM1 may be omitted as desired.

A side surface of the second polarization part ARU2 and a side surface of the bending protection layer SNL, which is adjacent to the side surface, may be spaced a predetermined interval from each other. The side surface of the second polarization part ARU2 may be closer to a center of the non-bending area NBA than the side surface of the bending protection layer SNL, which is adjacent thereto. Accordingly, during a bending process, the side surface of the bending protection layer SNL and the side surface of the second polarization part ARU2, which is adjacent to the side surface, may be prevented from colliding with each other.

The bending protection layer SNL may be disposed on the display panel DP. The bending protection layer SNL may overlap the bending area BA and may be bent together with the bending area BA of the display panel DP. A portion of the bending protection layer SNL may partially overlap the non-bending area NBA of the display panel DP. The bending protection layer SNL may effectively prevent a bent portion of the display panel DP from being damaged by an external impact or effectively prevent foreign substances from flowing thereinto.

The bending protection layer SNL may be disposed on a front surface of the display panel DP and protect the bent portion of the display panel DP. The bending protection layer SNL may include a plastic film as a base layer. The bending protection layer SNL may include a plastic film including at least one selected from polyethersulfone (PES), polyacrylate (PAR), polyetherimide (PEI), polyethylenen naphthalate (PEN), polyethylene terephthalate (PET), polyphenylene sulfide (PPS), polyarylate, polyimide (PI), polycarbonate (PC), poly(aryleneether sulfone), and combinations thereof.

However, a material constituting the bending protection layer SNL is not limited to the plastic resins and may include an organic/inorganic composite material. The bending protection layer SNL may include a porous organic layer and an inorganic material filled in pores of the organic layer. The bending protection layer SNL may have a single-layer structure or a multi-layer structure.

Figure 5B:
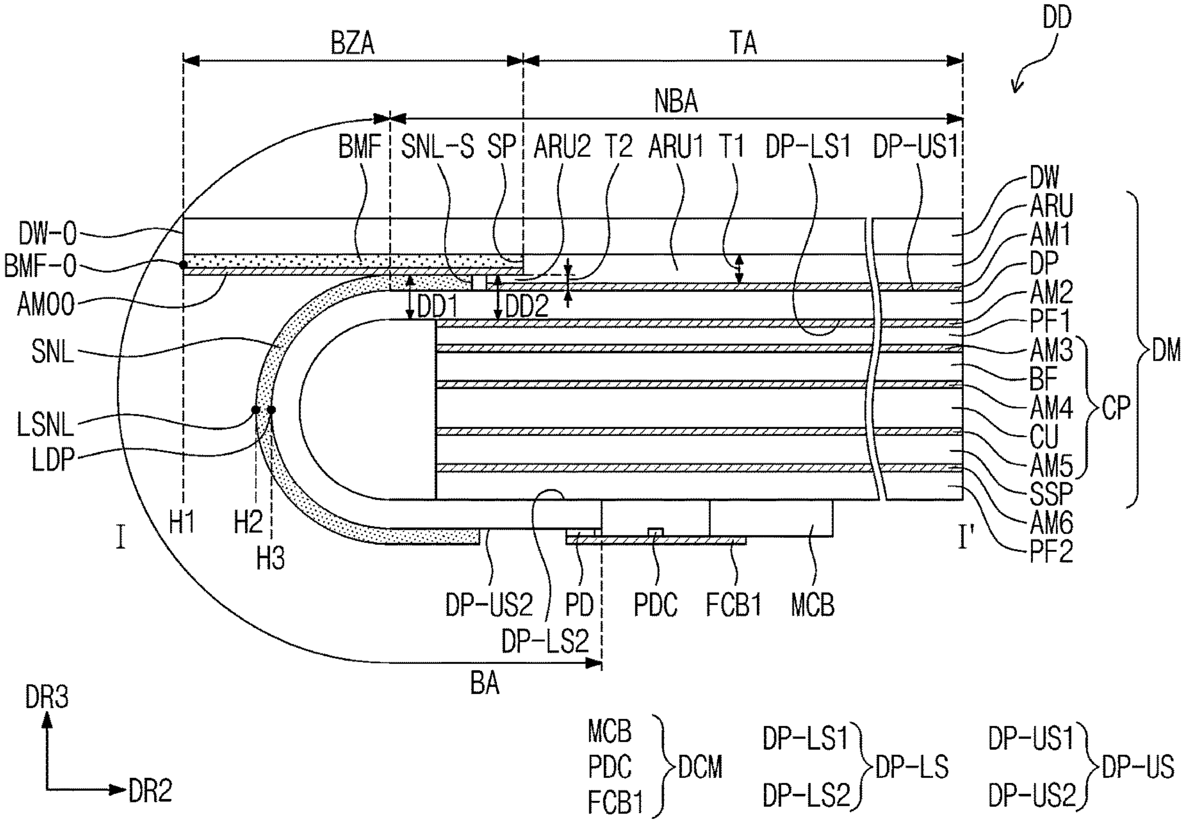
FIG. 5B is a cross-sectional view of the display device according to an embodiment of the disclosure.

The driving control module DCM may be coupled to a distal end of the display panel DP. The driving control module DCM may include the first circuit board FCB1, the panel driving circuit PDC, and the main circuit board MCB. The first circuit board FCB1 may electrically connect the main circuit board MCB and the display panel DP, and the panel driving circuit PDC may be mounted on the first circuit board FCB1. In an embodiment, as shown in FIG. 5B the panel driving circuit PDC is mounted on the first circuit board FCB1, but a position of the panel driving circuit PDC is not limited thereto. In an alternative embodiment, for example, the panel driving circuit PDC may be directly disposed on the upper surface DP-US of the display panel DP.

The first circuit board FCB1 may be electrically connected to the signal pads PD. Here, the signal pads PD may correspond to signal pads PD arranged in the pad area NDA-PD (see FIG. 3) of FIG. 3.

The second protective film PF2 may be coupled to the distal end of the display panel DP and the driving control module DCM. When the display panel DP is bent, one surface of the second protective film PF2 may come into contact with the sixth adhesive layer AM6.

The light shielding film BMF may be adhered to the upper surface of the bending protection layer SNL and the second polarization part ARU2. The light shielding film BMF may be adhered onto the step SP. The light shielding film BMF may cover or overlap the bent portion of the display panel DP in a plan view. The light shielding film BMF may cover a bent portion of the bending protection layer SNL in a plan view. The light shielding film BMF may be adhered to a portion of the upper surface of the bending protection layer SNL and the upper surface of the second polarization part ARU2 by a first lower adhesive layer AM0.

The light shielding film BMF may be a rigid board extending in the second direction DR2 and including a light shielding material. The light shielding film BMF may serve as a base layer when the resin material is applied to form the coating window DW. The light shielding film BMF may serve as a barrier that prevent a liquid resin material from penetrating into the bent portion of the display panel DP or the bent portion of the bending protection layer SNL.

A sum of a thickness of the light shielding film BMF and a thickness of the first lower adhesive layer AM0 may be substantially the same as a difference between the first thickness T1 and the second thickness T2. That is, an upper surface of the light shielding film BMF and the upper surface of the polarization unit ARU may be horizontally aligned with each other (or on a same level as each other) on a cross section.

A side surface of the light shielding film BMF may be in contact with the step SP of the polarization unit ARU. That is, no space may be defined between the side surface of the light shielding film BMF and the step SP of the polarization unit ARU. Accordingly, even when the resin material is applied onto the upper surface of the light shielding film BMF and the upper surface of the polarization unit ARU to form the coating window DW, the resin material may not penetrate or flow into the display panel DP.

An outer surface BMF-0 of the light shielding film BMF and an outer surface DW-0 of the coating window DW may be aligned with each other on a cross section. That is, the outer surface BMF-O of the light shielding film BMF and the outer surface DW-0 of the coating window DW may be arranged on a straight line on a cross section. Accordingly, separation between the coating window DW and the light shielding film BMF due to an external impact may be minimized.

The coating window DW may be directly disposed on the polarization unit ARU and the light shielding film BMF. That is, the coating window DW may be disposed on the polarization unit ARU and the light shielding film BMF without a separate adhesive layer or separate adhesive member. The coating window DW may include a material cured by laser irradiation. The coating window DW may be formed by applying a resin material such as an optically transparent resin and curing the applied resin material.

The light shielding film BMF may cover the bent portion of the bending protection layer SNL in a plan view. The light shielding film BMF may cover the bent portion of the display panel DP in a plan view. Accordingly, the bent portion of the display panel DP and the bent portion of the bending protection layer SNL may not be visually recognized from the outside.

The outer surface BMF-0 of the light shielding film BMF may protrude outward beyond a point LSNL of the bent portion of the bending protection layer SNL, which is most distant from the non-bending area NBA. The outer surface BMF-0 of the light shielding film BMF may be more distant from the non-bending area NBA of the bent portion of the bending protection layer SNL than the most distant point LSNL. The outer surface BMF-0 of the light shielding film BMF may protrude outward beyond a point LDP of the bent portion of the display panel DP, which is most distant from the non-bending area NBA.

A position of a point BMF-0 of the light shielding film BMF, which is most distant from the non-bending area NBA, in the second direction DR2 may be defined as a first position H1. A position of the point LSNL of the bent portion of the bending protection layer SNL, which is most distant from the non-bending area NBA, in the second direction DR2 may be defined as a second position H2. A position of the point LDP of the bent portion of the display panel DP, which is most distant from the non-bending area NBA, in the second direction DR2 may be defined as a third position H3. The first position H1 may be more distant from the non-bending area NBA than the second position H2 and the third position H3. The second position H2 may be more distant from the non-bending area NBA than the third position H3.

When the coating window DW is formed by applying the resin material such as a resin and then curing the resin material, it may be impossible to separately couple the light shielding pattern BM to the rear surface of the coating window DW. Accordingly, a rigid board may be used as the light shielding film BMF, the light shielding film BMF may be adhered to the bending protection layer SNL and the polarization unit ARU, and the resin material may be applied onto the light shielding film BMF.

The first protective film PF1 may be disposed on a first rear surface DP-LS1 of the display panel DP. The first protective film PF1 may be adhered to the first rear surface DP-LS1 by the second adhesive layer AM2. However, the second adhesive layer AM2 may be omitted as desired. The first protective film PF1 may protect the first rear surface DP-LS1 of the display panel DP from an external impact.

The protective panel CP may be disposed on the first rear surface DP-LS1 of the display panel DP. The protective panel CP may protect the display panel DP from an impact or the like transmitted from the lower side.

The protective panel CP may include a third adhesive layer AM3, a barrier layer BF, a fourth adhesive layer AM4, a cushion layer CU, and a fifth adhesive layer AM5. The barrier layer BF may be adhered to a lower surface of the first protective film PF1 by the third adhesive layer AM3. The barrier layer BF may have a color with low light transmittance to prevent visual recognition of components under the barrier layer BF.

The barrier layer BF may include a flexible synthetic resin film. For example, the barrier layer BF may be a film including polyimide (PI), polyethylene terephthalate (PET), or the like. However, the material of the barrier layer BF is not limited thereto, and the barrier layer BF may have various materials as desired.

The cushion layer CU may be adhered to a lower surface of the barrier layer BF by the fourth adhesive layer AM4. The cushion layer CU may absorb an impact transmitted from a lower portion of the display panel DP. The cushion layer CU may include or be made of a highly elastic material such as a foam sheet with holes, pores or openings therein.

The support panel SSP may be disposed below the protective panel CP to support the display panel DP and the protective panel CP. The support panel SSP may be adhered to a lower surface of the cushion layer CU by the fifth adhesive layer AM5. The support panel SSP may be a metal plate having a rigidity greater than or equal to a predetermined standard. In an embodiment, for example, the support panel SSP may be a stainless steel plate. The support panel SSP may have a black color to shield an external light beam input to the display panel DP.

FIG. 5B is a cross-sectional view of the display device DD according to an embodiment of the disclosure.

The display device DD of FIG. 5B is substantially the same as the display device DD (see FIG. 5A) shown in FIG. 5A except for a second lower adhesive layer AM00. The same or like elements shown in FIG. 5B have been labeled with the same reference characters as used above to describe the embodiment of the display device DD shown in FIG. 5A, and any repetitive detailed description thereof will hereinafter be omitted.

In an embodiment, the light shielding film BMF may be adhered to a portion of the upper surface of the bending protection layer SNL and the upper surface of the second polarization part ARU2 by the second lower adhesive layer AM00. In such an embodiment, the light shielding film BMF may be detachably adhered onto one area of the upper surface of the bending protection layer SNL. In such an embodiment, an adhesive force of the second lower adhesive layer AM00 may be less than that of the first lower adhesive layer AM0 shown in FIG. 5A.

Since the light shielding film BMF is detachably adhered onto the one area of the upper surface of the bending protection layer SNL, the bending protection layer SNL may be bent after the light shielding film BMF is adhered to the upper surface of the bending protection layer SNL. That is, as illustrated in FIGS. 10B and 10C, after the light shielding film BMF is adhered to the upper surface of the bending protection layer SNL before bending, the bending protection layer SNL may be bent. An adhesive force of the second lower adhesive layer AM00 may be weak in a way such that the shape of the light shielding film BMF may be maintained even when only the bending protection layer SNL is bent in a state in which the light shielding film BMF and the bending protection layer SNL are adhered to each other. This will be described below in greater detail with reference to FIGS. 10A to 10C.

Figure 6A:
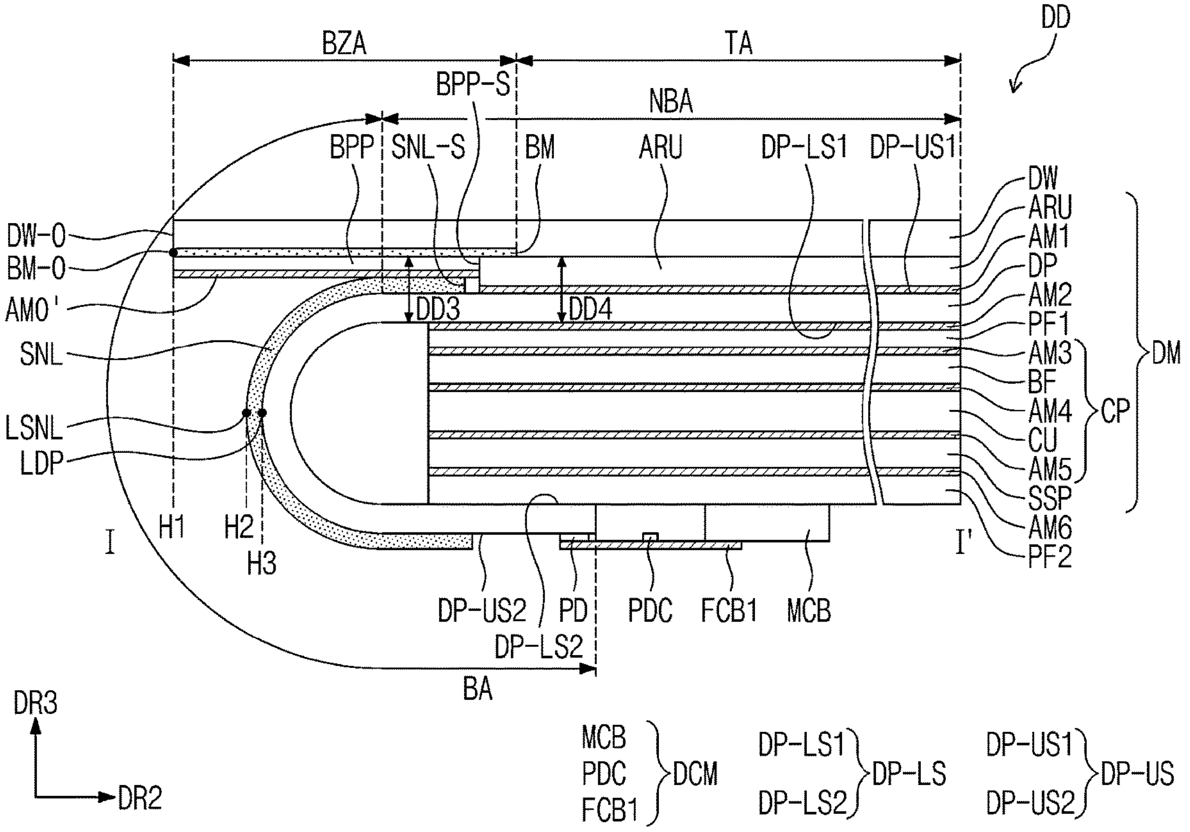
FIG. 6A is a cross-sectional view of the display device according to an embodiment of the disclosure.

FIG. 6A is a cross-sectional view of the display device DD according to an embodiment of the disclosure. Hereinafter, the same reference numerals are used for the same components as those described above with reference to FIGS. 5A and 5B, and any repetitive detailed descriptions thereof will be omitted.

Referring to FIG. 6A, in an embodiment, the bending protection layer SNL may be disposed between the display panel DP and a first auxiliary film BPP. The bending protection layer SNL may be bent together with the bending area BA of the display panel DP. The polarization unit ARU may be disposed on the display panel DP. The polarization unit ARU may have a constant thickness and extend in the second direction DR2. The polarization unit ARU may overlap the non-bending area NBA. A distal end of the polarization unit ARU may overlap the bezel area BZA. In such an embodiment, a light shielding pattern BM may be disposed above the distal end of the polarization unit ARU.

The first auxiliary film BPP may be adhered onto the bending protection layer SNL. A lower surface of the first auxiliary film BPP may be adhered onto the upper surface of the bending protection layer SNL by a first lower adhesive layer AM0'. The first auxiliary film BPP may overlap the bending area BA and extend in the opposite direction to the second direction DR2. An outer surface of the polarization unit ARU overlapping the light shielding pattern BM and a side surface BPP-S of the first auxiliary film BPP adjacent thereto may be in contact with each other. An upper surface of the first auxiliary film BPP may extend from (or on a same level as) the upper surface of the polarization unit ARU.

A distance DD3 from the upper surface of the first auxiliary film BPP to the first rear surface DP-LS1 of the display panel DP may be substantially the same as a distance DD4 from the upper surface of the polarization unit ARU to the first rear surface DP-LS1 of the display panel DP. That is, the upper surface of the first auxiliary film BPP and the upper surface of the polarization unit ARU may extend to constitute one plane with no step.

In such an embodiment, a resin material for forming the coating window DW may be applied onto the upper surface of the first auxiliary film BPP and the upper surface of the polarization unit ARU. That is, the upper surface of the first auxiliary film BPP and the upper surface of the polarization unit ARU may serve as a base layer for forming the coating window DW. In such an embodiment, since the first auxiliary film BPP and the polarization unit ARU are in contact with each other with no separation, penetration of the resin material into the display panel DP and the bending protection layer SNL may be prevented.

The light shielding pattern BM may be directly disposed on the first auxiliary film BPP and the polarization unit ARU. That is, neither a separate adhesive layer nor a separate adhesive may be disposed between the light shielding pattern BM and the first auxiliary film BPP. In such an embodiment, neither a separate adhesive layer nor a separate adhesive may be disposed between the light shielding pattern BM and the polarization unit ARU. In such an embodiment, the light shielding pattern BM may be formed by coating and curing a light shielding material.

The light shielding pattern BM may cover the bent portions of the bending area BA of the display panel DP and the bending protection layer SNL in a plan view. An outer surface BM-0 of the light shielding pattern BM may protrude outward beyond the point LDP of the bent portion of the display panel DP, which is most distant from the non-bending area NBA. The outer surface BM-0 of the light shielding pattern BM may protrude outward beyond the point LSNL of the bent portion of the bending protection layer SNL, which is most distant from the non-bending area NBA.

A position of a point BM-0 of the light shielding pattern BM, which is most distant from the non-bending area NBA, in the second direction DR2 may be defined as the first position H1. A position of the point LSNL of the bent portion of the bending protection layer SNL, which is most distant from the non-bending area NBA, in the second direction DR2 may be defined as the second position H2. The position of the point LDP of the bent portion of the display panel DP, which is most distant from the non-bending area NBA, in the second direction DR2 may be defined as the third position H3. The first position H1 may be more distant from the non-bending area NBA than the second position H2 and the third position H3. The second position H2 may be more distant from the non-bending area NBA than the third position H3.

The coating window DW may be directly disposed on an upper surface of the light shielding pattern BM and the upper surface of the polarization unit ARU. The coating window DW may be formed by a process of applying a resin material having light transmittance onto the light shielding pattern BM and the polarization unit ARU and curing the resin material.

Figure 6B:
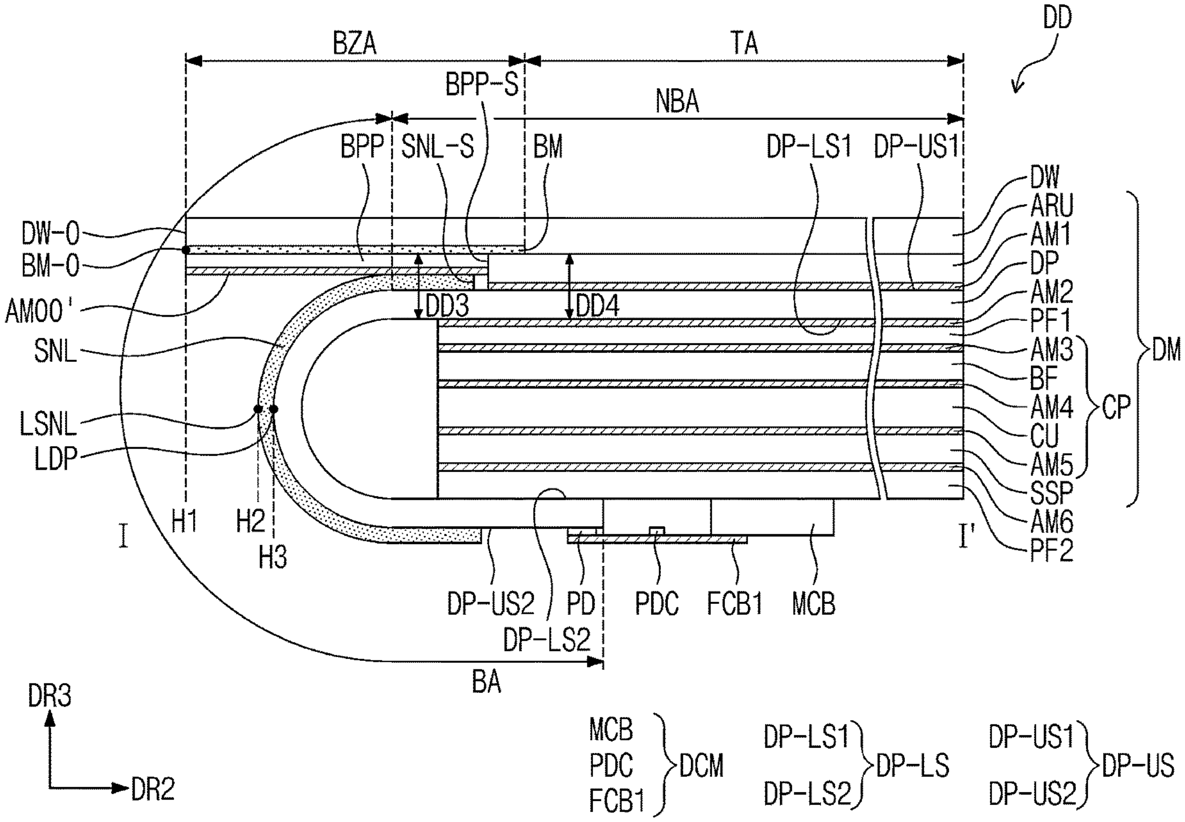
FIG. 6B is a cross-sectional view of the display device according to an embodiment of the disclosure.

FIG. 6B is a cross-sectional view of the display device DD according to an embodiment of the disclosure.

The display device DD of FIG. 6B is the same as the display device DD shown in FIG. 6A except for the second lower adhesive layer AM00'. The same or like elements shown in FIG. 6B have been labeled with the same reference characters as used above to describe the embodiment of the display device DD shown in FIG. 6A, and any repetitive detailed description thereof will hereinafter be omitted.

In an embodiment, the first auxiliary film BPP may be adhered onto a portion of the upper surface of the bending protection layer SNL by a second lower adhesive layer AM00'. In such an embodiment, the lower surface of the first auxiliary film BPP may be detachably adhered onto the one area of the upper surface of the bending protection layer SNL. An adhesive force of the second lower adhesive layer AM00' may be weaker than that of the first lower adhesive layer AM0 (see FIG. 6A) of FIG. 6A.

Since the first auxiliary film BPP is detachably adhered onto the one area of the upper surface of the bending protection layer SNL, the bending protection layer SNL may be bent after the first auxiliary film BPP is adhered to the upper surface of the bending protection layer SNL. In an embodiment, as illustrated in FIGS. 12C and 12D, after the first auxiliary film BPP is adhered to the upper surface of the bending protection layer SNL before bending, the bending protection layer SNL may be bent. An adhesive force of the second lower adhesive layer AM00' may be weak in a way such that the shape of the first auxiliary film BPP may be maintained even when only the bending protection layer SNL is bent in a state in which the first auxiliary film BPP and the bending protection layer SNL are adhered to each other. This will be described below in greater detail with reference to FIGS. 12A to 12D.

Figure 7:
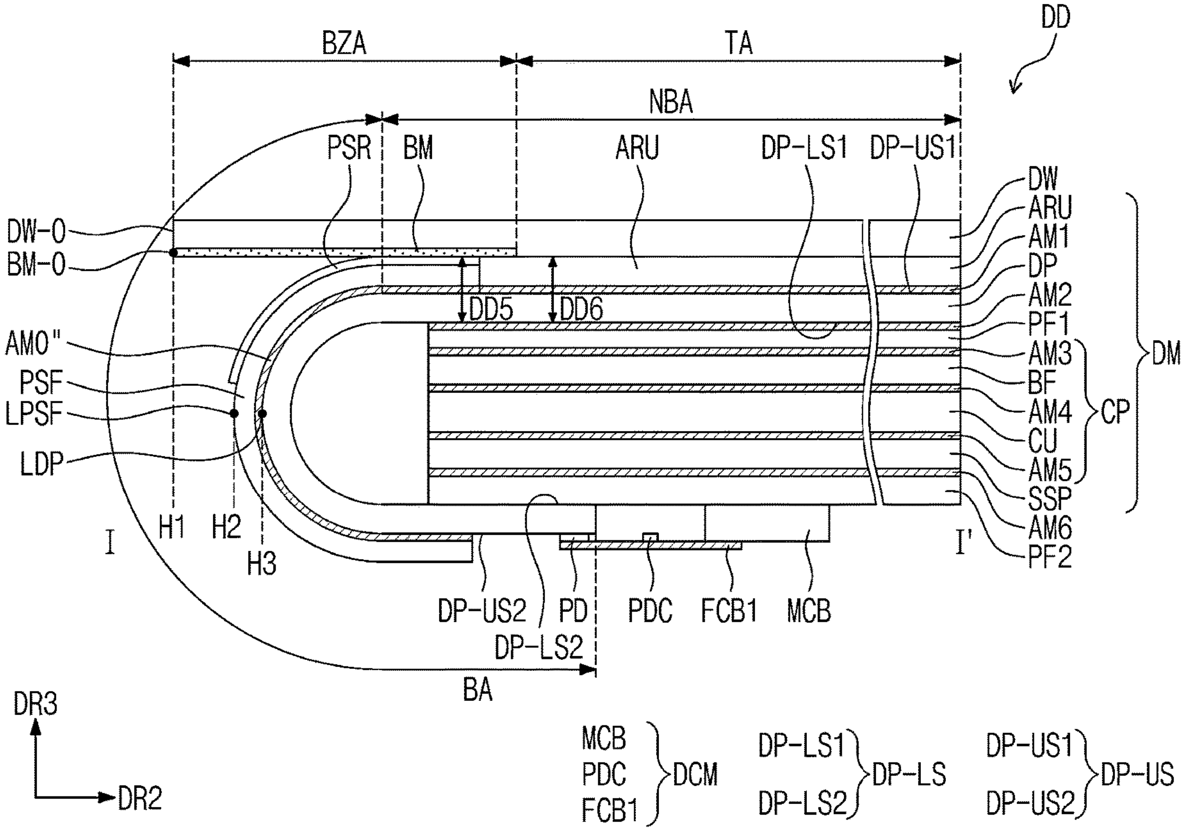
FIG. 7 is a cross-sectional view of the display device according to an embodiment of the disclosure.

FIG. 7 is a cross-sectional view of the display device DD according to an embodiment of the disclosure. Hereinafter, the same reference numerals are used for the same components as those described in FIGS. 6A and 6B, and any repetitive detailed descriptions thereof will be omitted.

Referring to FIG. 7, in an embodiment, a second auxiliary film PSF may be adhered onto the upper surface of the display panel DP by a lower adhesive layer AM0". The second auxiliary film PSF may be bent together with the bending area BA of the display panel DP. The second auxiliary film PSF bent in this way may prevent the bent display panel DP from being exposed to the outside and thus protect the bending area BA of the display panel DP. The second auxiliary film PSF may prevent the bent portion of the display panel DP from being damaged by an external impact or prevent foreign substances from being introduced into the bent portion of the display panel DP.

A portion of an upper surface of the second auxiliary film PSF, which corresponds to the light shielding pattern BM, may be coated with a release agent PSR. Since the release agent PSR is coated between the second auxiliary film PSF and the light shielding pattern BM, even when only the second auxiliary film PSF is bent in a state in which the light shielding pattern BM is disposed on the second auxiliary film PSF, the shape of the light shielding pattern BM may be maintained. This will be described below in greater detail with reference to FIGS. 13A to 13D.

A thickness of the second auxiliary film PSF coated with the release agent PSR (i.e., a sum of a thickness of the second auxiliary film PSF coated with the release agent PSR and a thickness of the release agent PSR) may be substantially the same as that of the polarization unit ARU. That is, a distance DD5 from the upper surface of the second auxiliary film PSF coated with the release agent PSR to the first rear surface DP-LS1 of the display panel DP may be substantially the same as a distance DD6 from the upper surface of the polarization unit ARU to the first rear surface DP-LS1 of the display panel DP. The upper surface of the second auxiliary film PSF coated with the release agent PSR and the upper surface of the polarization unit ARU may serve as a base layer on which the light shielding pattern BM is formed. In an embodiment, the light shielding pattern BM may be formed by applying a light shielding material to the upper surface of the second auxiliary film PSF coated with the release agent PSR and the upper surface of the polarization unit ARU and curing the applied light shielding material. The upper surface of the second auxiliary film PSF coated with the release agent PSR and the upper surface of the polarization unit ARU may constitute one flat surface. In such an embodiment, no step structure is defined between the upper surface of the release agent PSR coated on the second auxiliary film PSF and the upper surface of the polarization unit ARU.

The light shielding pattern BM may cover the bent portions of the bending area BA of the display panel DP and the bending protection layer SNL in a plan view. The outer surface BM-0 of the light shielding pattern BM may protrude outward beyond the point LDP of the bent portion of the display panel DP, which is most distant from the non-bending area NBA. The outer surface BM-0 of the light shielding pattern BM may protrude outward beyond a point LPSF of the bent portion of the second auxiliary film PSF, which is most distant from the non-bending area NBA.

A position of the point BM-0 of the light shielding pattern BM, which is most distant from the non-bending area NBA, in the second direction DR2 may be defined as a first position H1. A position of the point LPSF of the bent portion of the second auxiliary film PSF, which is most distant from the non-bending area NBA, in the second direction DR2 may be defined as a second position H2. The position of the point LDP of the bent portion of the display panel DP, which is most distant from the non-bending area NBA, in the second direction DR2 may be defined as a third position H3. The first position H1 may be more distant from the non-bending area NBA than the second position H2 and the third position H3. The second position H2 may be more distant from the non-bending area NBA than the third position H3.

Figure 8:
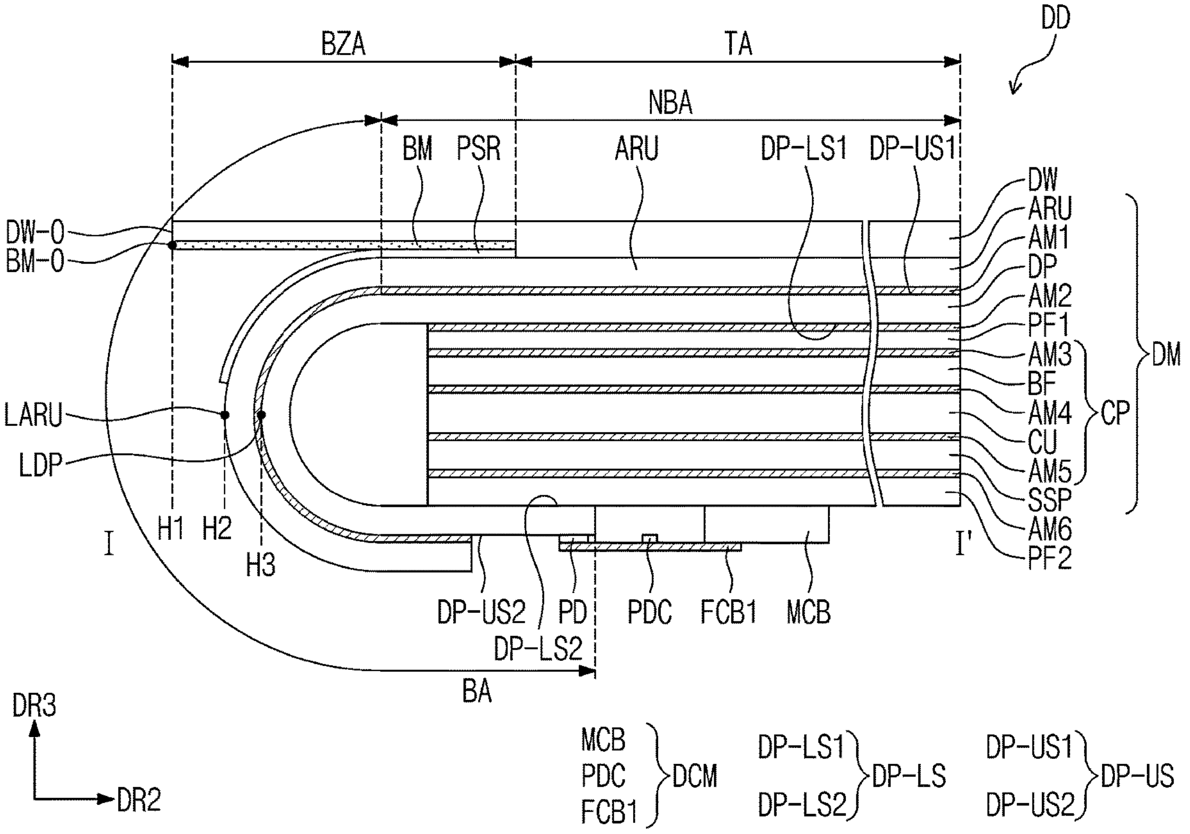
FIG. 8 is a cross-sectional view of the display device according to an embodiment of the disclosure.

FIG. 8 is a cross-sectional view of the display device DD according to an embodiment of the disclosure. Hereinafter, the same reference numerals are used for the same components as those of the display device DD described above with reference to FIGS. 6A and 6B, and any repetitive detailed descriptions thereof will be omitted.

Referring to FIG. 8, in an embodiment, the polarization unit ARU may be disposed on the display panel DP and may be bent together with the bending area BA. The polarization unit ARU may be a polarization film or a polarization board that is flexible and has high ductility. The polarization unit ARU may be adhered onto the first upper surface DP-US1 of the display panel DP by the first adhesive layer AM1. The polarization unit ARU may prevent the bent display panel DP from being exposed to the outside and thus protect the bending area BA of the display panel DP. That is, the polarization unit ARU may prevent the bent portion of the display panel DP from being damaged by an external impact or prevent foreign substances from being introduced into the bent portion of the display panel DP.

A portion of the upper surface of the polarization unit ARU, which corresponds to the light shielding pattern BM, may be coated with the release agent PSR. The release agent PSR may be coated only at a portion of the upper surface of the polarization unit ARU, which overlaps the light shielding pattern BM, in the second direction DR2. Since the release agent PSR is coated between the polarization unit ARU and the light shielding pattern BM, even when only the polarization unit ARU is bent in a state in which the light shielding pattern BM is disposed on the polarization unit ARU, the shape of the light shielding pattern BM may be maintained. This will be described below in greater detail with reference to FIGS. 14A to 14D.

The light shielding pattern BM may be directly disposed on the upper surface of the polarization unit ARU coated with the release agent PSR. The upper surface of the polarization unit ARU coated with the release agent PSR may serve as a base layer on which the light shielding pattern BM is formed. In an embodiment, the light shielding pattern BM may be formed by applying a light shielding material onto the upper surface of the polarization unit ARU coated with the release agent PSR and curing the applied the applied light shielding material.

The light shielding pattern BM may cover the bent portion of the display panel DP in a plan view. The light shielding pattern BM may cover a bent portion of the polarization unit ARU in a plan view. The outer surface BM-0 of the light shielding pattern BM may protrude outward beyond a point LARU of the bent portion of the polarization unit ARU, which is most distant from the non-bending area NBA. The outer surface BM-0 of the light shielding pattern BM may protrude outward beyond the point LDP of the bent portion of the display panel DP, which is most distant from the non-bending area NBA.

The position of the point BM-0 of the light shielding pattern BM, which is most distant from the non-bending area NBA, in the second direction DR2 may be defined as a first position H1. A position of the point LARU of the bent portion of the polarization unit ARU, which is most distant from the non-bending area NBA, in the second direction DR2 may be defined as a second position H2. The position of the point LDP of the bent portion of the display panel DP, which is most distant from the non-bending area NBA, in the second direction DR2 may be defined as a third position H3. The first position H1 may be more distant from the non-bending area NBA than the second position H2 and the third position H3. The second position H2 may be more distant from the non-bending area NBA than the third position H3.

The coating window DW may be directly disposed on the light shielding pattern BM and the polarization unit ARU and include a resin material. The coating window DW may be formed by applying a resin material having light transmittance onto the upper surface of the light shielding pattern BM and the upper surface of the polarization unit ARU and curing the applied resin material.

FIGS. 9A to 9F are cross-sectional views illustrating processes of the method of manufacturing the display device DD according to an embodiment of the disclosure. FIGS. 9A to 9F are cross-sectional views illustrating processes of the method of manufacturing the display device DD (see FIG. 5A) illustrated in FIG. 5A. Hereinafter, the same reference numerals are used for the same components as those described above with reference to FIG. 5A, and any repetitive detailed descriptions thereof will be omitted.

Figure 9A:
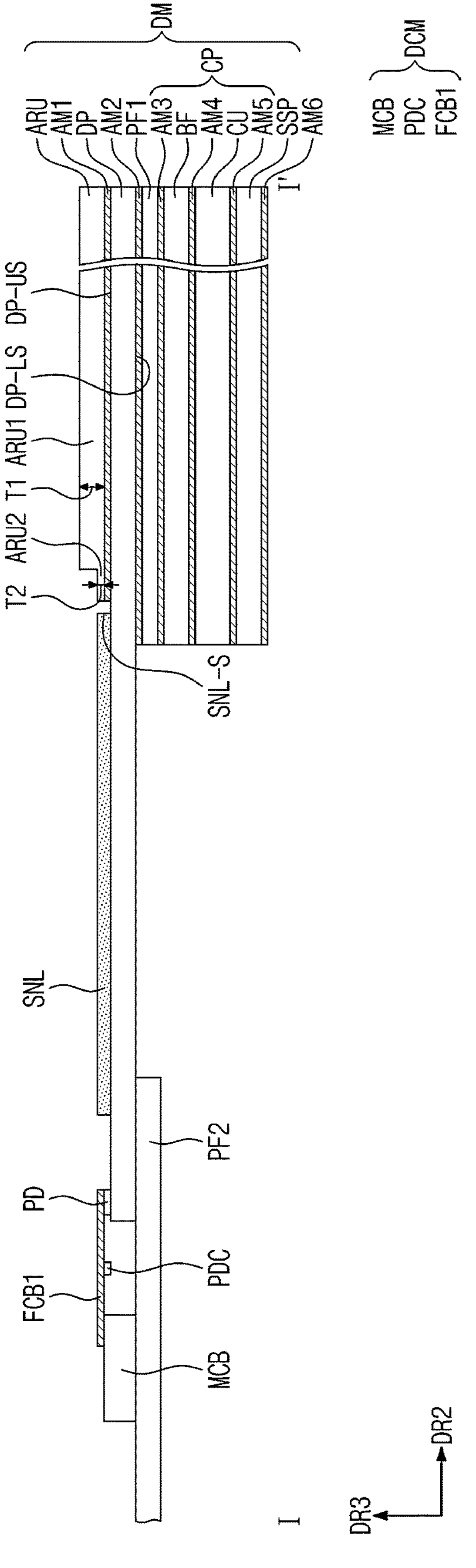
FIGS. 9A to 9F are cross-sectional views illustrating processes of a method of manufacturing the display device according to an embodiment of the disclosure.

Referring to FIG. 9A, in an embodiment of the method of manufacturing the display device DD, the display module DM and the driving control module DCM may be prepared. The display module DM illustrated in FIG. 9A is in an unbent state before the display panel DP and the bending protection layer SNL are bent. The polarization unit ARU may be adhered onto the upper surface of the display panel DP by the first adhesive layer AM1. The polarization unit ARU in which the step SP is defined at an end portion thereof may be disposed on the display panel DP.

Figure 9B:
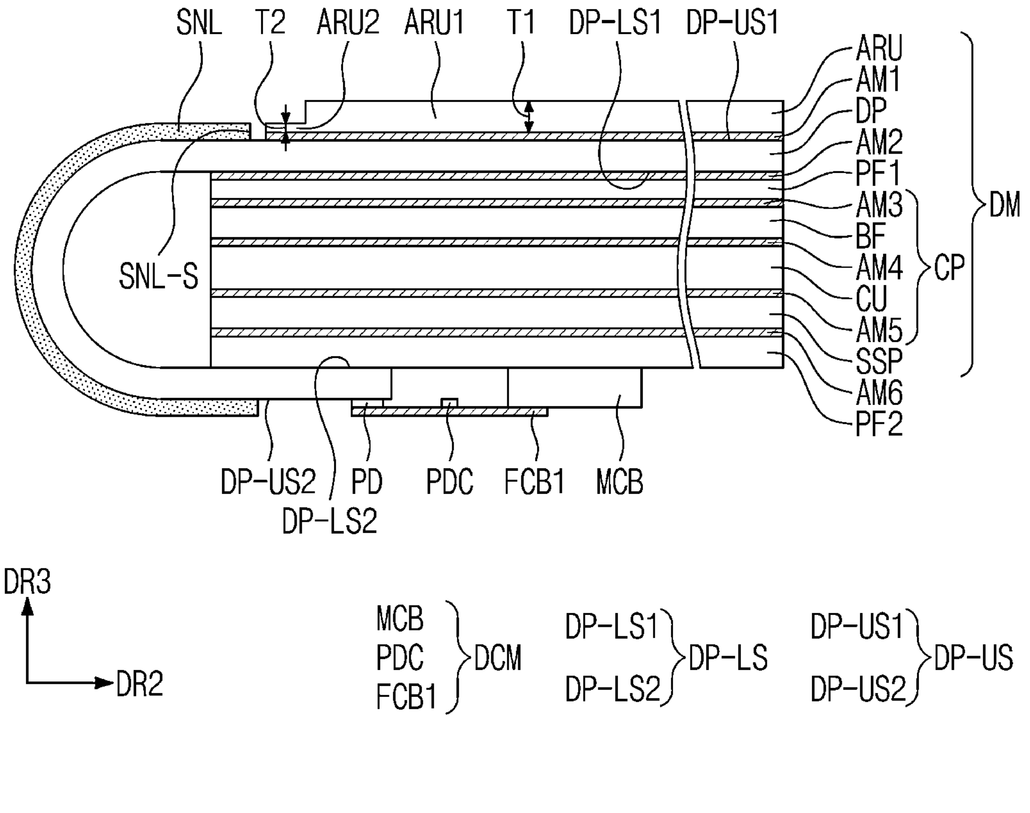

Referring to FIG. 9B, the display panel DP and the bending protection layer SNL may be bent together. Accordingly, the second protective film PF2 may be adhered onto a support panel SSP by the sixth adhesive layer AM6.

Figure 9C:
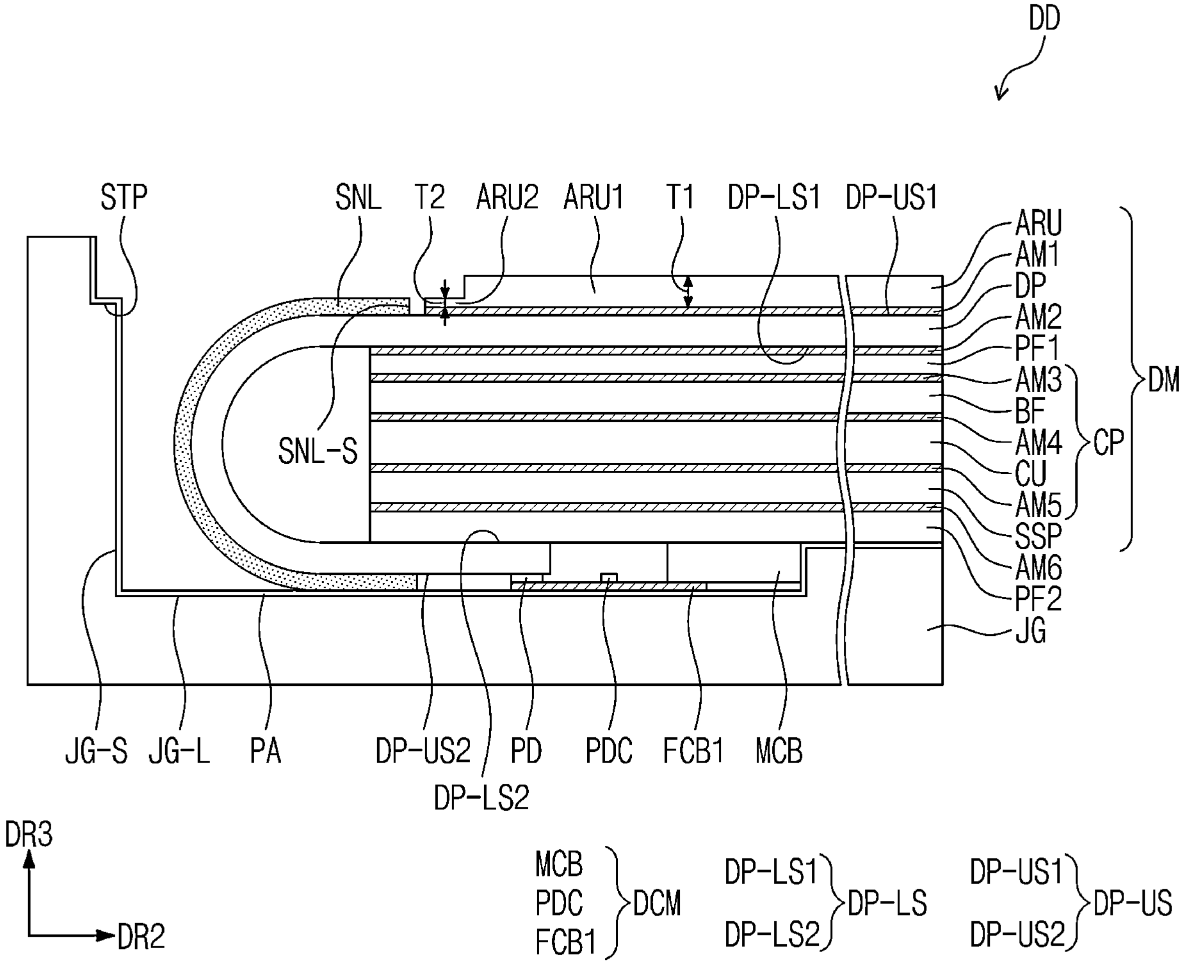

Referring to FIG. 9C, the display module DM and the driving control module DCM may be arranged on a jig JG. A release agent PA may be coated on a lower surface JG-L and a side surface JG-S of the jig JG. Accordingly, the jig JG may be easily removed from the display device DD. A step corresponding to the display module DM and the driving control module DCM may be defined on the lower surface JG-L of the jig JG. The side surface JG-S of the jig JG may be spaced a predetermined distance from the bent display panel DP and the bent bending protection layer SNL in the second direction DR2. The step STP may be defined on the side surface JG-S of the jig JG.

Figure 9D:
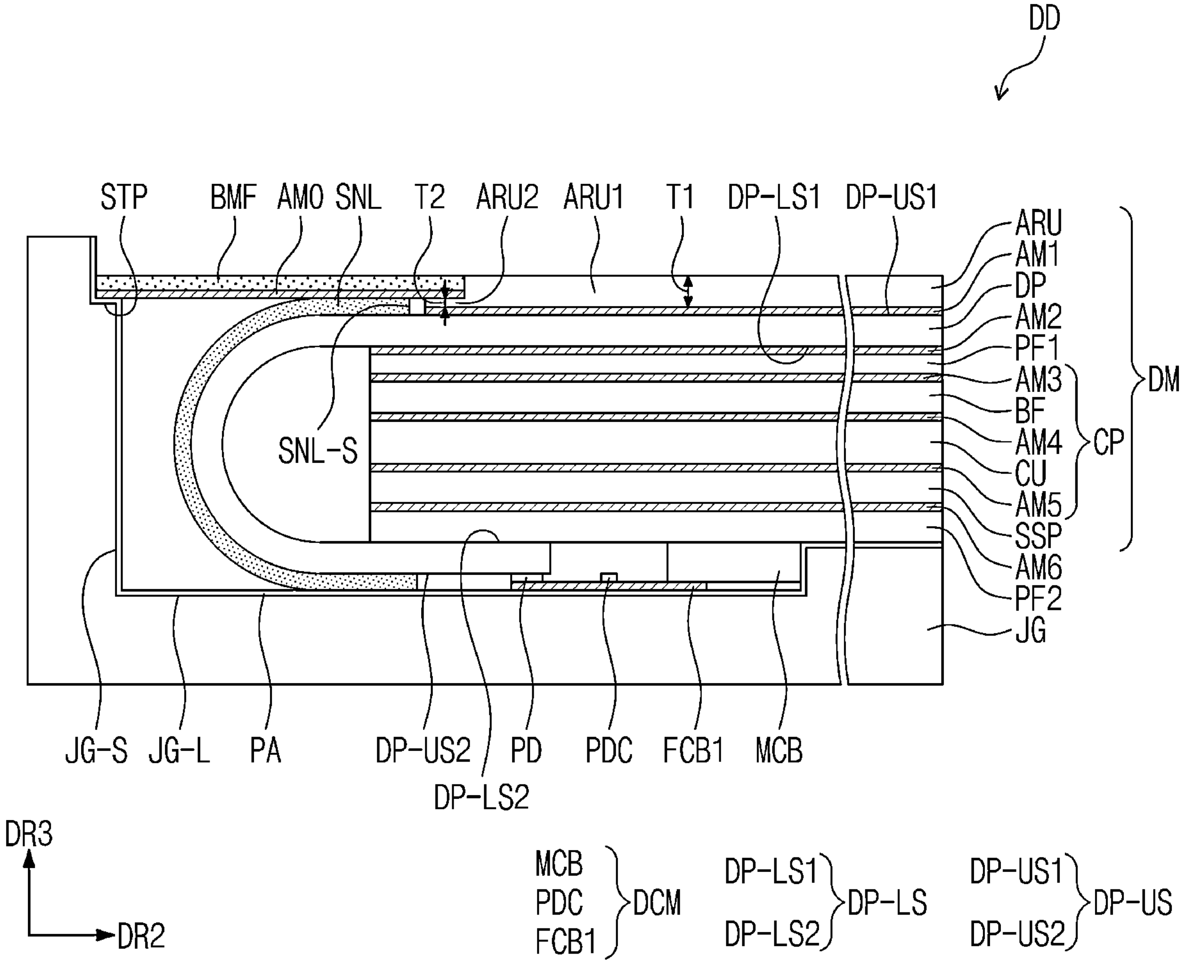

Referring to FIG. 9D, the light shielding film BMF may be adhered to the upper surface of the bending protection layer SNL and the upper surface of the second polarization part ARU2. The light shielding film BMF may be adhered onto the upper surface of the bending protection layer SNL and the upper surface of the second polarization part ARU2 by the first lower adhesive layer AM0. One end of the light shielding film BMF may be seated on the second polarization part ARU2, and the opposing end of the light shielding film BMF may be seated on the step STP of the jig JG. The step STP of the jig JG may have a shape corresponding to the one end of the light shielding film BMF.

Figure 9E:
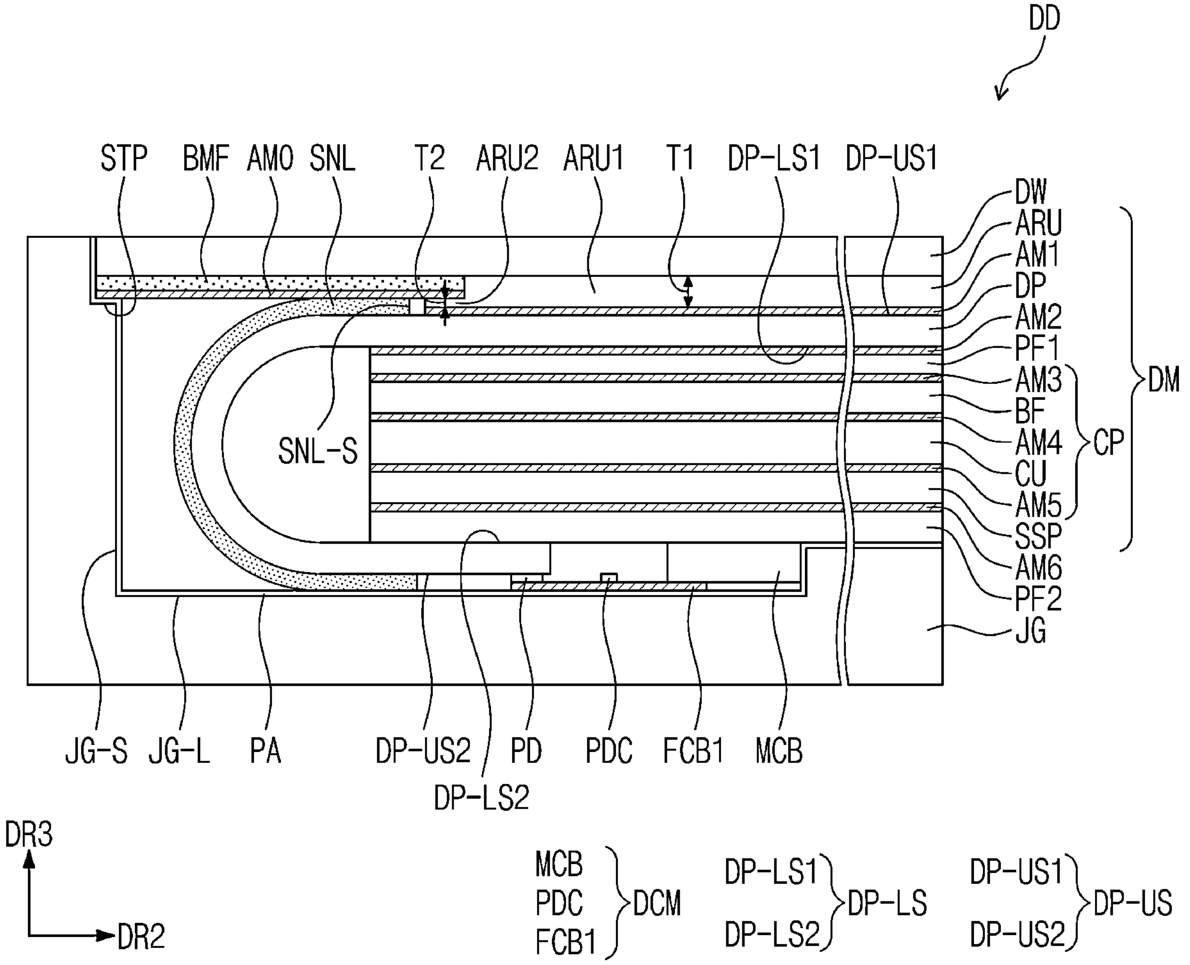

Referring to FIG. 9E, the coating window DW may be formed directly on the light shielding film BMF and the polarization unit ARU. In an embodiment, a resin material having light transmittance may be applied onto the light shielding film BMF and the polarization unit ARU. The coating window DW may be formed by irradiating the applied resin material with a laser beam and curing the applied resin material. The step STP of the jig JG may serve as a mold for forming a shape of the applied resin material. The outer surface DW-0 of the coating window DW formed by the step STP may be aligned with the outer surface BMF-0 of the light shielding film BMF on a cross section.

Figure 9F:
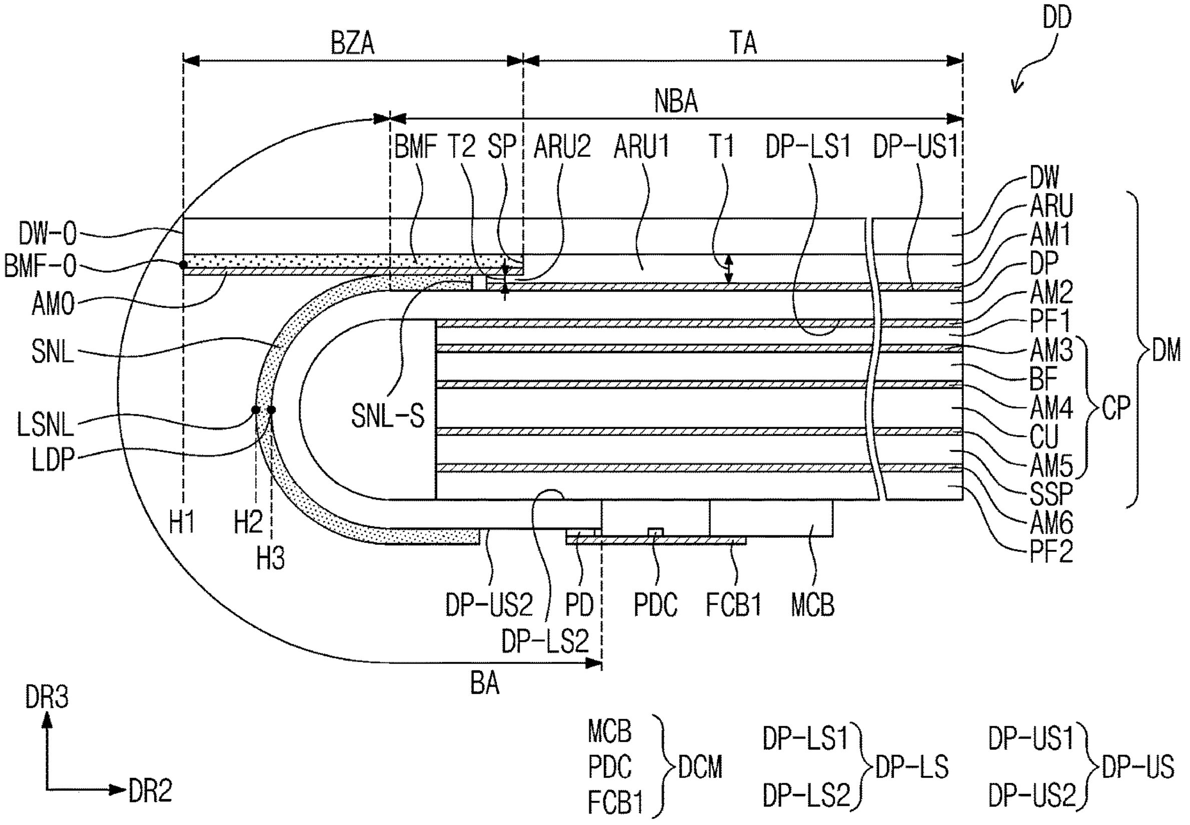

Referring to FIGS. 9E and 9F, the jig JG may be removed from the display device DD. The release agent PA is coated on the side surface JG-S and the lower surface JG-L of the jig JG, and thus the jig JG may be effectively or easily removed.

Figure 10A:
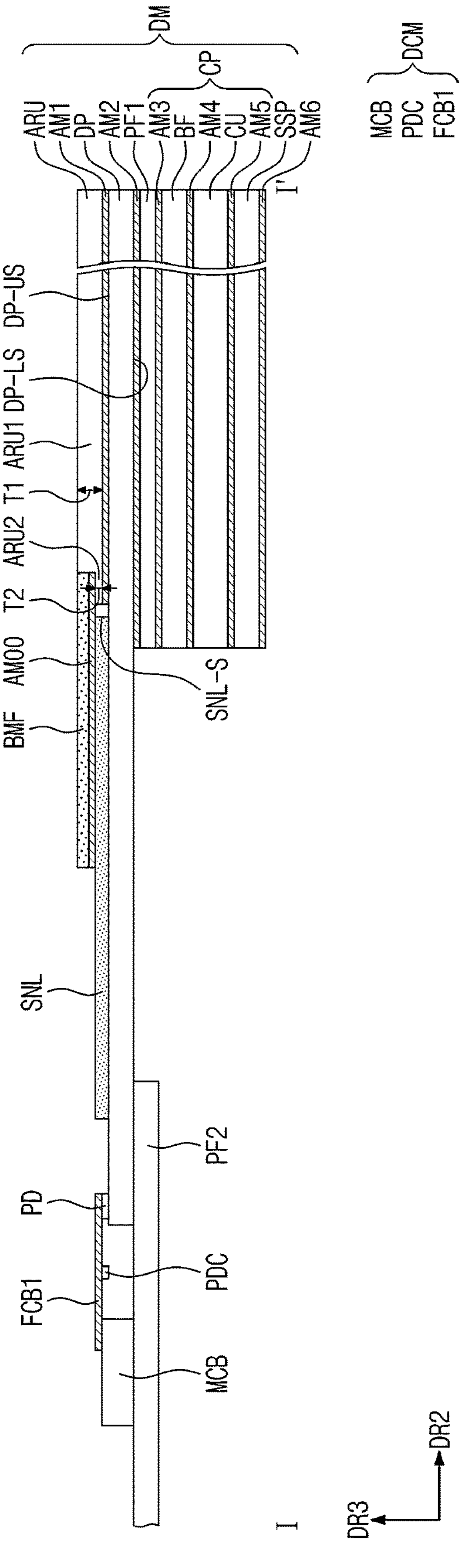
FIGS. 10A to 10C are cross-sectional views illustrating processes of the method of manufacturing the display device according to an embodiment of the disclosure.
Figure 10B:
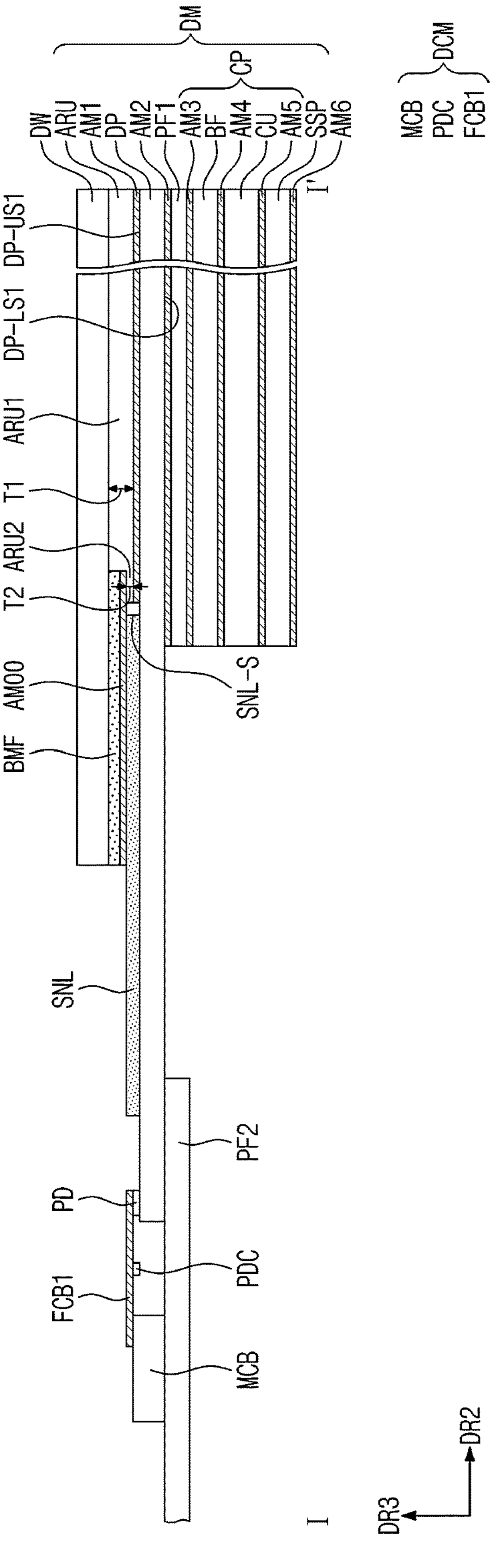
Figure 10C:
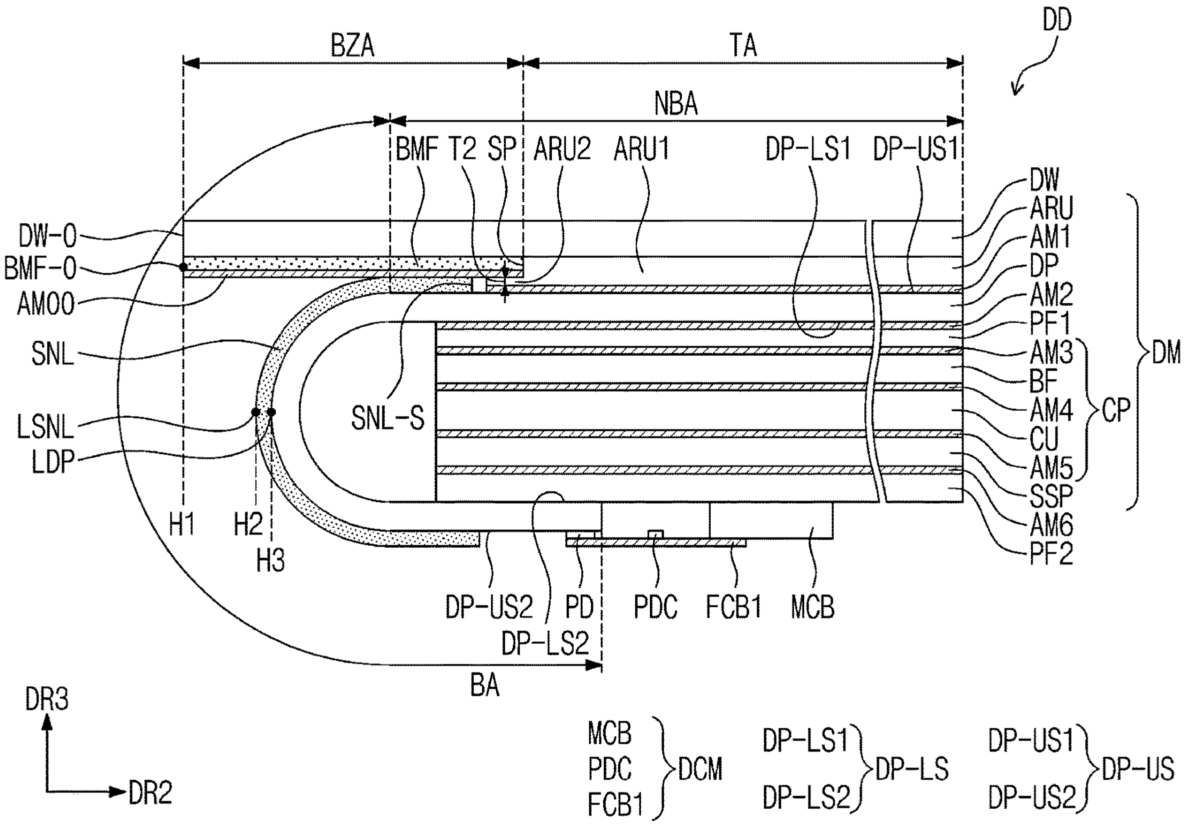

FIGS. 10A to 10C are cross-sectional views illustrating processes of the method of manufacturing the display device DD according to an embodiment of the disclosure. FIGS. 10A to 10C illustrate the method of manufacturing the display device DD (see FIG. 5B) of FIG. 5B. Hereinafter, the same reference numerals are used for the same components as those described above with reference to FIG. 5B, and any repetitive detailed descriptions thereof will be omitted.

Referring to FIG. 10A, in an embodiment of the method of manufacturing the display device DD, the display module DM and the driving control module DCM may be prepared. The display module DM illustrated in FIG. 10A is in an unbent state before the display panel DP and the bending protection layer SNL are bent. The polarization unit ARU may be adhered onto the upper surface of the display panel DP by the first adhesive layer AM1. The polarization unit ARU in which the step SP (see FIG. 5B) is defined may be disposed on the display panel DP.

The light shielding film BMF may be in contact with the upper surface of the bending protection layer SNL and the upper surface of the second polarization part ARU2 by the second lower adhesive layer AM00. The second lower adhesive layer AM00 may allow the light shielding film BMF and the bending protection layer SNL to be adhered to each other in a detachable manner.

Referring to FIG. 10B, the coating window DW may be formed directly on the light shielding film BMF and the polarization unit ARU. The coating window DW may be formed by applying a resin material having light transmittance onto the light shielding film BMF and the polarization unit ARU and curing the applied resin material.

Referring to FIG. 10C, the display panel DP and the bending protection layer SNL may be bent. Accordingly, the second protective film PF2 may be adhered onto the support panel SSP by the sixth adhesive layer AM6. During the bending process, a portion (see FIG. 10B) of the bending protection layer SNL, which is previously adhered to the light shielding film BMF by the second lower adhesive layer AM00, may be separated from the light shielding film BMF. The second lower adhesive layer AM00 may have a sufficiently small adhesive force so that the bending protection layer SNL is easily separated from the light shielding film BMF during the bending process. Accordingly, during the bending process, the shape of the light shielding film BMF may not be deformed and a stress applied to the light shielding film BMF may be reduced.

FIGS. 11A to 11G are cross-sectional views illustrating processes of the method of manufacturing the display device DD according to an embodiment of the disclosure. FIGS. 11A to 11G illustrate processes of the method of manufacturing the display device DD (see FIG. 6A) illustrated in FIG. 6A. Hereinafter, the same reference numerals are used for the same components as those described above with reference to FIG. 6A, and any repetitive detailed descriptions thereof will be omitted.

Figure 11A:
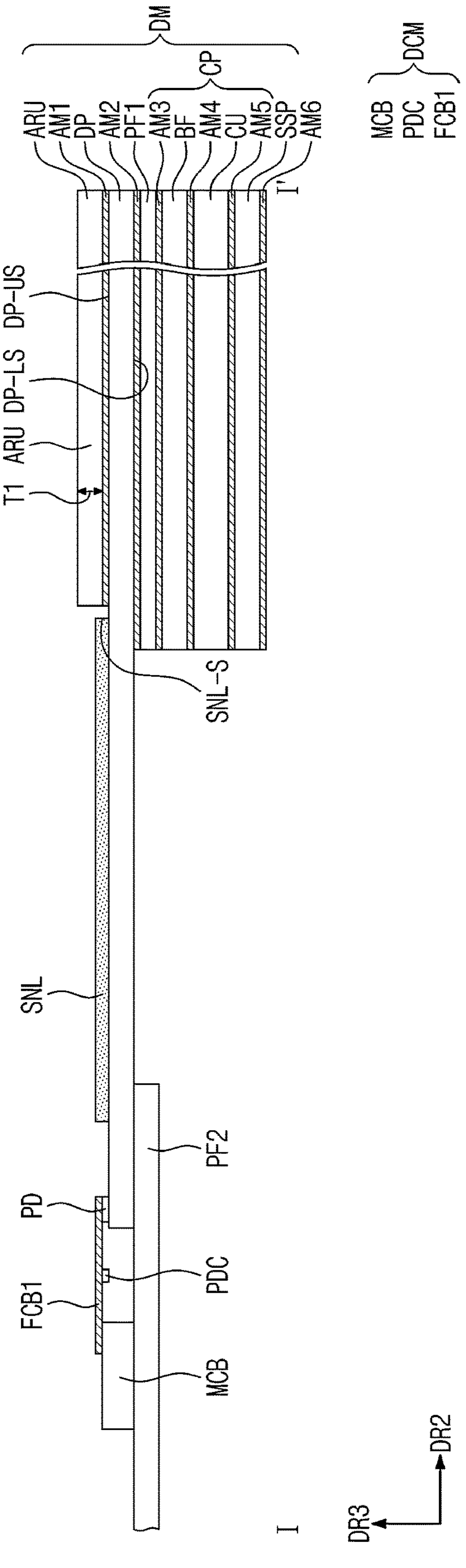
FIGS. 11A to 11G are cross-sectional views illustrating processes of the method of manufacturing the display device according to an embodiment of the disclosure.

Referring to FIG. 11A, in an embodiment of the method of manufacturing the display device DD, the display module DM and the driving control module DCM may be prepared. The display module DM illustrated in FIG. 11A is in an unbent state before the display panel DP and the bending protection layer SNL are bent. The polarization unit ARU may be disposed on the display panel DP. The polarization unit ARU may be adhered onto the upper surface of the display panel DP by the first adhesive layer AM1. The polarization unit ARU may have a constant thickness and extend in the second direction DR2.

Figure 11B:
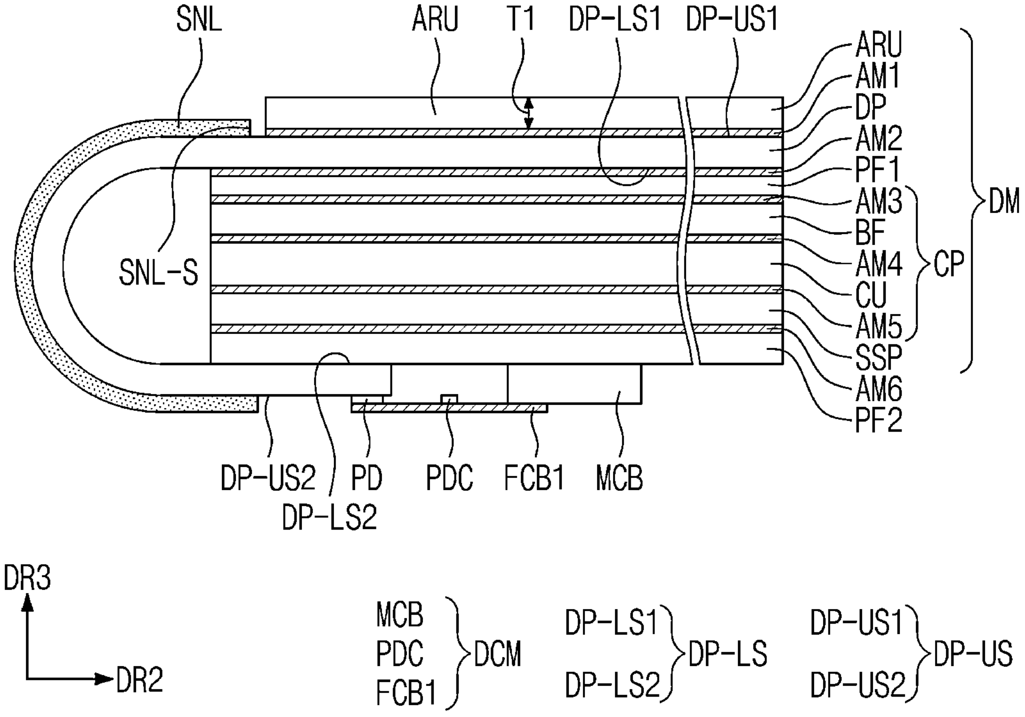

Referring to FIG. 11B, the display panel DP and the bending protection layer SNL may be bent. Accordingly, the second protective film PF2 may be adhered onto the support panel SSP by the sixth adhesive layer AM6.

Figure 11C:
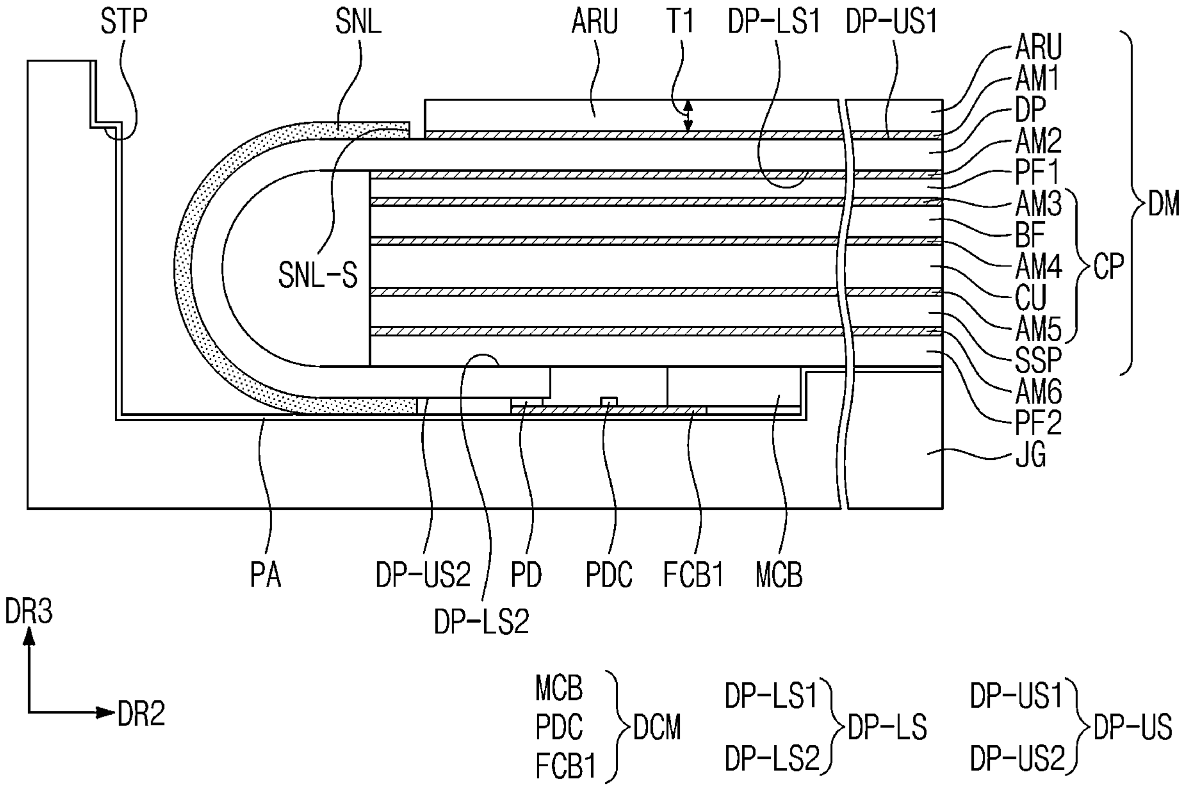

Referring to FIG. 11C, the display module DM and the driving control module DCM may be arranged on the jig JG. The release agent PA may be coated on the lower surface JG-L and the side surface JG-S of the jig JG. Accordingly, the jig JG may be easily removed from the display device DD. The step corresponding to the display module DM and the driving control module DCM may be defined on the lower surface JG-L of the jig JG. The side surface JG-S of the jig JG may be spaced a predetermined distance from the bent display panel DP and the bent bending protection layer SNL in the second direction DR2. The step STP may be defined on the side surface JG-S of the jig JG.

Figure 11D:
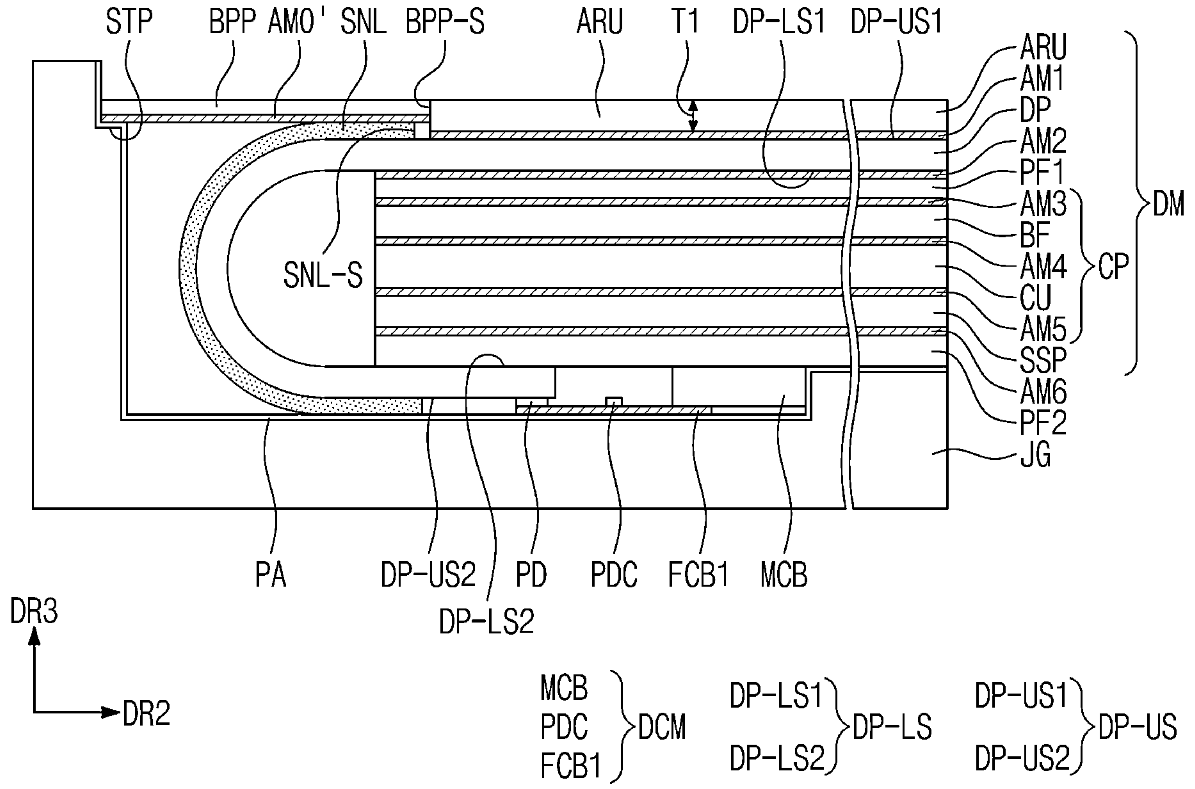

Referring to FIG. 11D, the first auxiliary film BPP may be adhered onto the upper surface of the bending protection layer SNL. The first auxiliary film BPP may be adhered onto the upper surface of the bending protection layer SNL by the first lower adhesive layer AM0'. One end of the first auxiliary film BPP may be in contact with the outer surface of the polarization unit ARU, and the opposing end of the first auxiliary film BPP may be seated on the step STP of the jig JG. The upper surface of the first auxiliary film BPP and the upper surface of the polarization unit ARU may have the same position in the third direction DR3. The upper surface of the first auxiliary film BPP and the upper surface of the polarization unit ARU may constitute one plane. A boundary between an upper surface of the first auxiliary film BPP and an upper surface of the polarization unit ARU may have no step. The side surface BPP-S of the first auxiliary film BPP and a side surface of the polarization unit ARU adjacent thereto may be in contact with each other while not separated from each other.

Figure 11E:
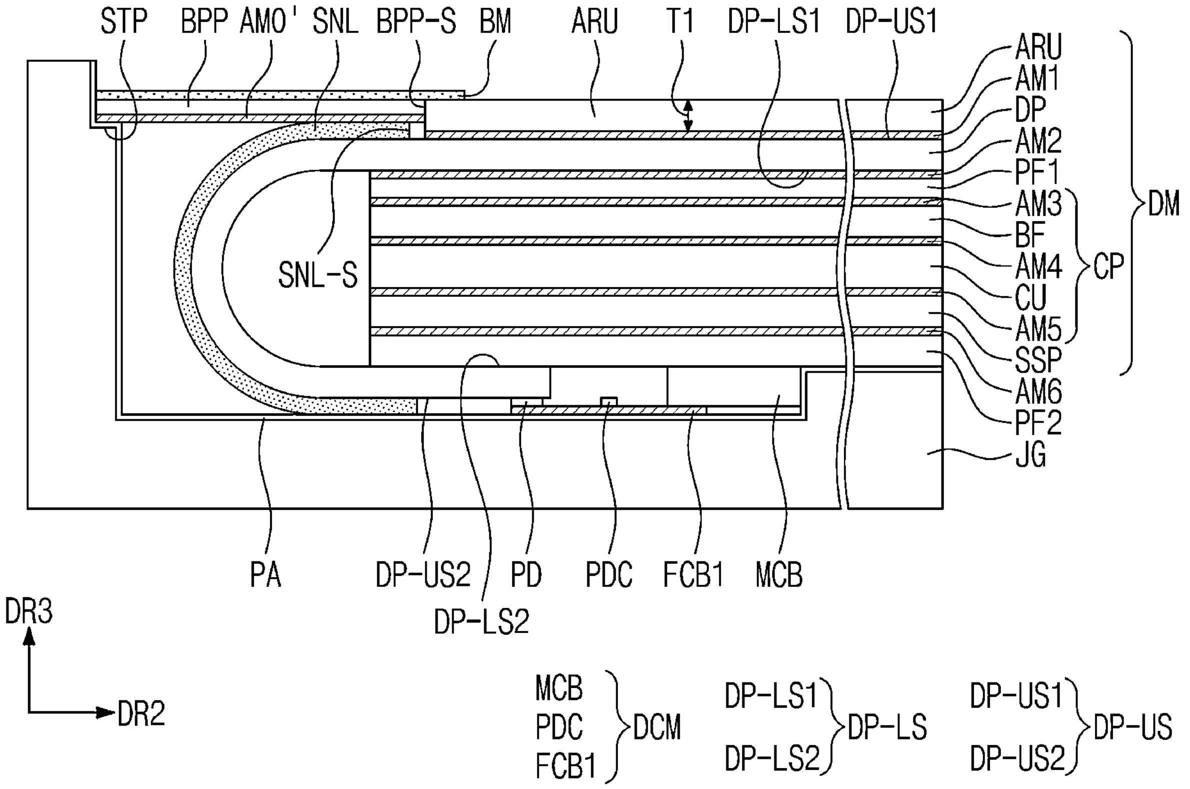

Referring to FIG. 11E, the light shielding pattern BM may be formed directly on the first auxiliary film BPP and the polarization unit ARU. The light shielding pattern BM may include a material cured by laser irradiation. In such an embodiment, the light shielding pattern BM may be formed by applying a light shielding material onto the first auxiliary film BPP and the polarization unit ARU and curing the applied light shielding material. In such an embodiment, a base plate to which a liquid light shielding material is applied may be used to form the light shielding pattern BM. The first auxiliary film BPP and the polarization unit ARU of FIG. 11E may serve as a base plate to which a liquid light shielding material is applied.

Figure 11F:
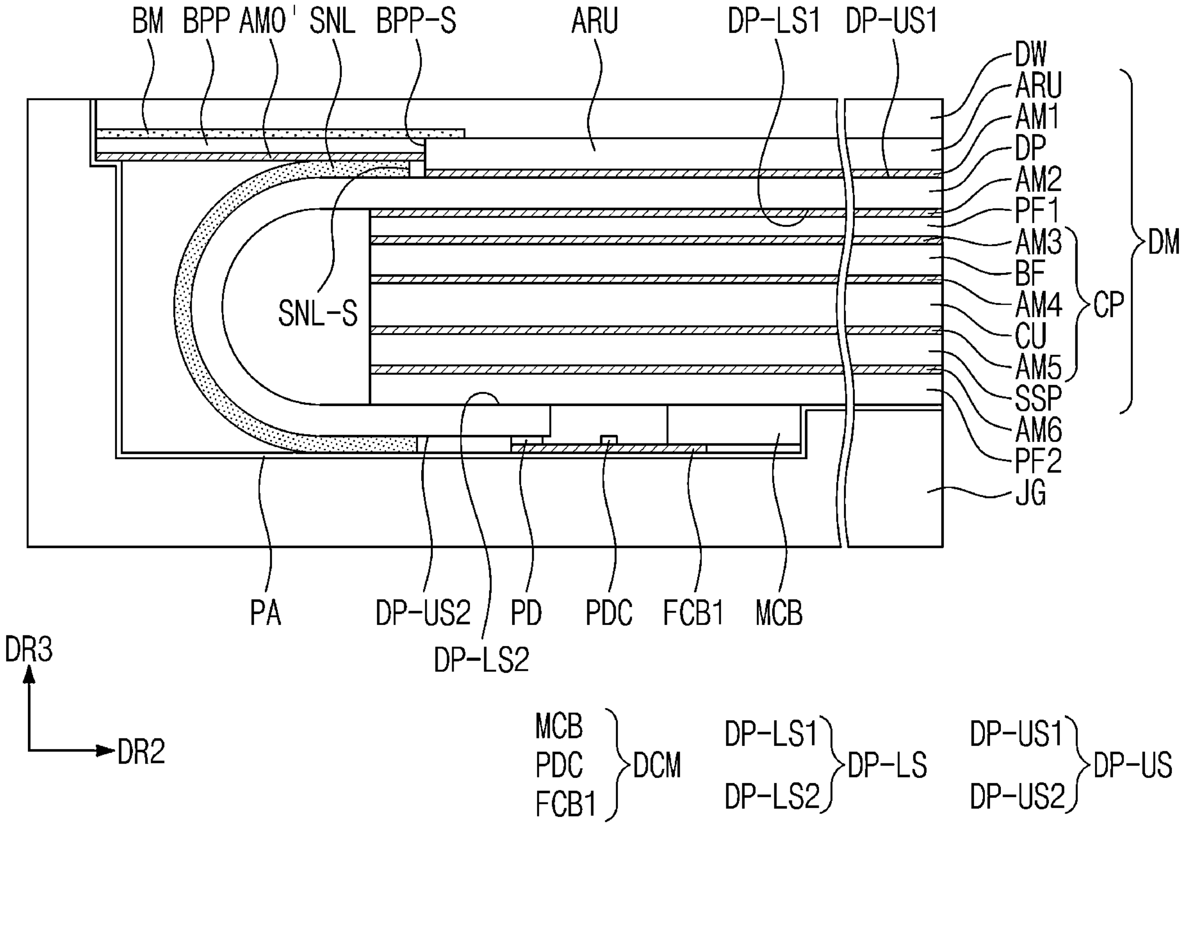

Referring to FIG. 11F, the coating window DW may be formed directly on the light shielding pattern BM and the polarization unit ARU. A resin material having light transmittance may be applied onto the light shielding pattern BM and the polarization unit ARU. The coating window DW may be formed by irradiating the applied resin material with a laser beam and curing the applied resin material. The step STP of the jig JG may serve as a mold for forming a shape of the applied resin material. The outer surface DW-0 of the coating window DW formed by the step STP may be aligned with the outer surface BM-0 of the light shielding pattern BM on a cross section.

Figure 11G:
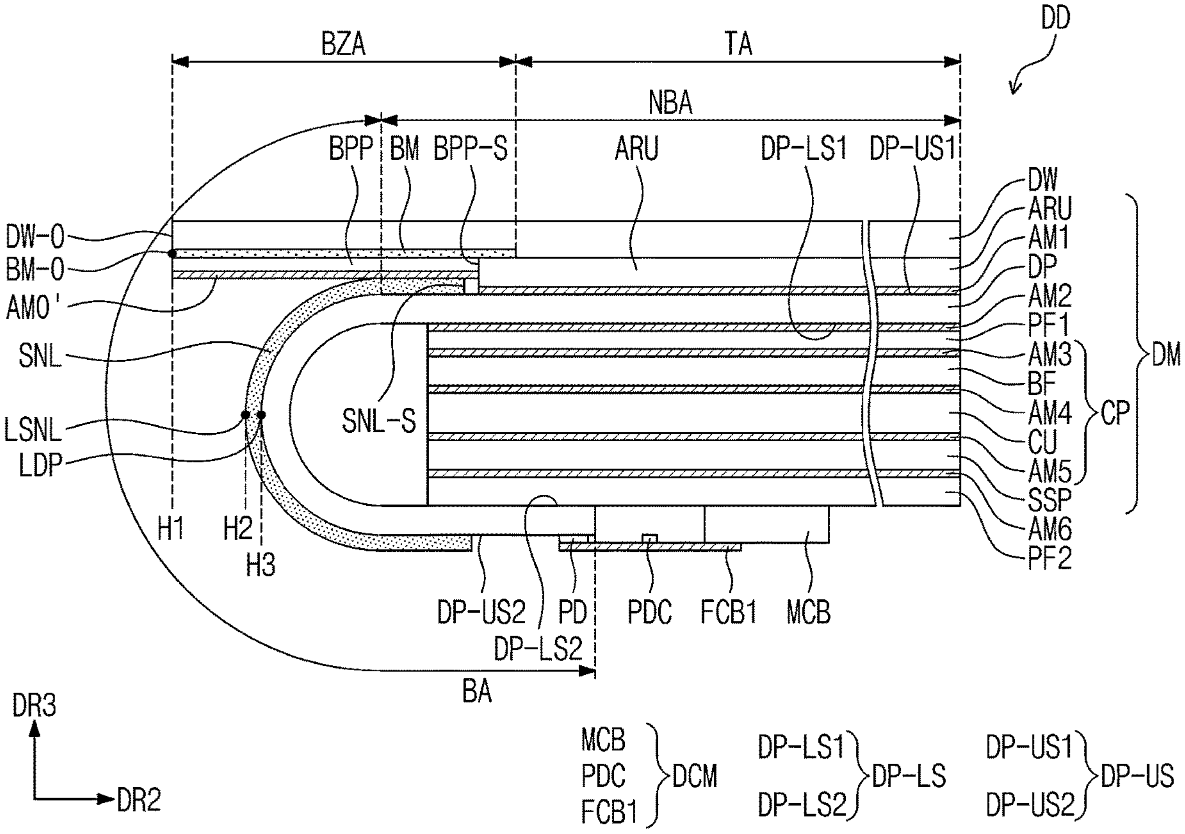

Referring to FIGS. 11F and 11G, the jig JG may be removed from the display device DD. The release agent PA is coated on the side surface JG-S and the lower surface JG-L of the jig JG, and thus the jig JG may be effectively or easily removed.

FIGS. 12A to 12D are cross-sectional views illustrating processes of the method of manufacturing the display device DD according to an embodiment of the disclosure. FIGS. 12A to 12D illustrate processes of the method of manufacturing the display device DD (see FIG. 6B) of FIG. 6B. Hereinafter, the same reference numerals are used for the same components as those described above with reference to FIG. 6B, and any repetitive detailed descriptions thereof will be omitted.

Figure 12A:
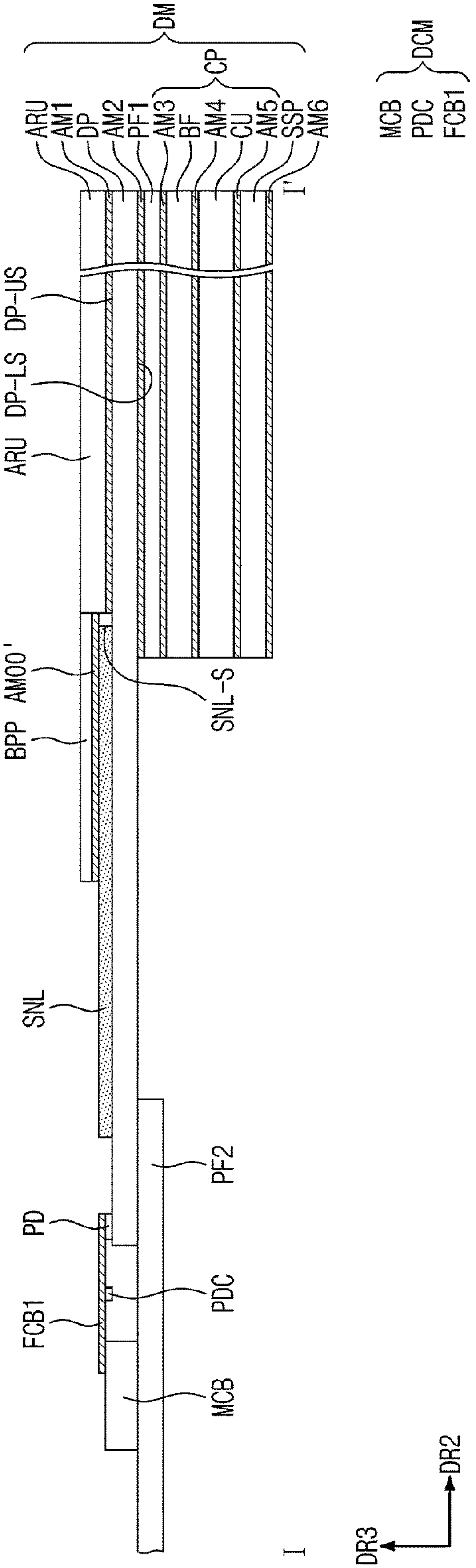
FIGS. 12A to 12D are cross-sectional views illustrating processes of the method of manufacturing the display device according to an embodiment of the disclosure.

Referring to FIG. 12A, in an embodiment of the method of manufacturing the display device DD, the display module DM and the driving control module DCM may be prepared. The display module DM illustrated in FIG. 12A is in an unbent state before the display panel DP and the bending protection layer SNL are bent. The polarization unit ARU may be adhered onto the upper surface of the display panel DP by the first adhesive layer AM1. The polarization unit ARU may have a constant thickness and extend in the second direction DR2.

The first auxiliary film BPP may be adhered onto the upper surface of the bending protection layer SNL. The first auxiliary film BPP may be adhered onto the upper surface of the bending protection layer SNL by the second lower adhesive layer AM00'. The second lower adhesive layer AM00' may allow the first auxiliary film BPP and the bending protection layer SNL to be adhered to each other in a detachable manner. The upper surface of the first auxiliary film BPP and the upper surface of the polarization unit ARU may have a same height in the third direction DR3. A boundary between the upper surface of the first auxiliary film BPP and the upper surface of the polarization unit ARU may have no step.

Figure 12B:
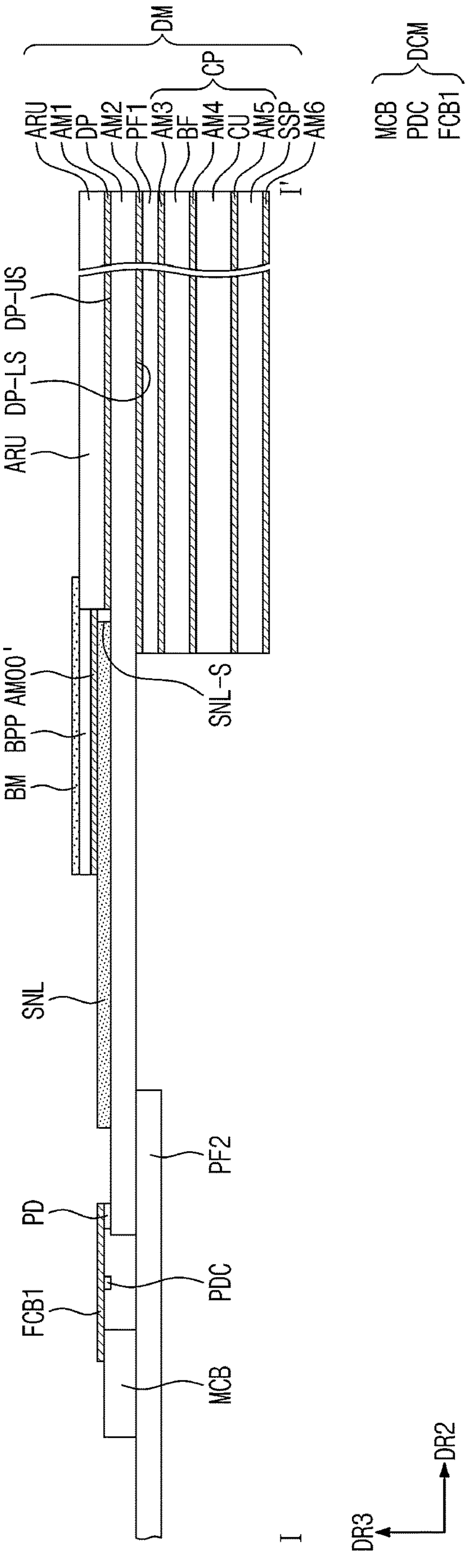
Figure 12C:
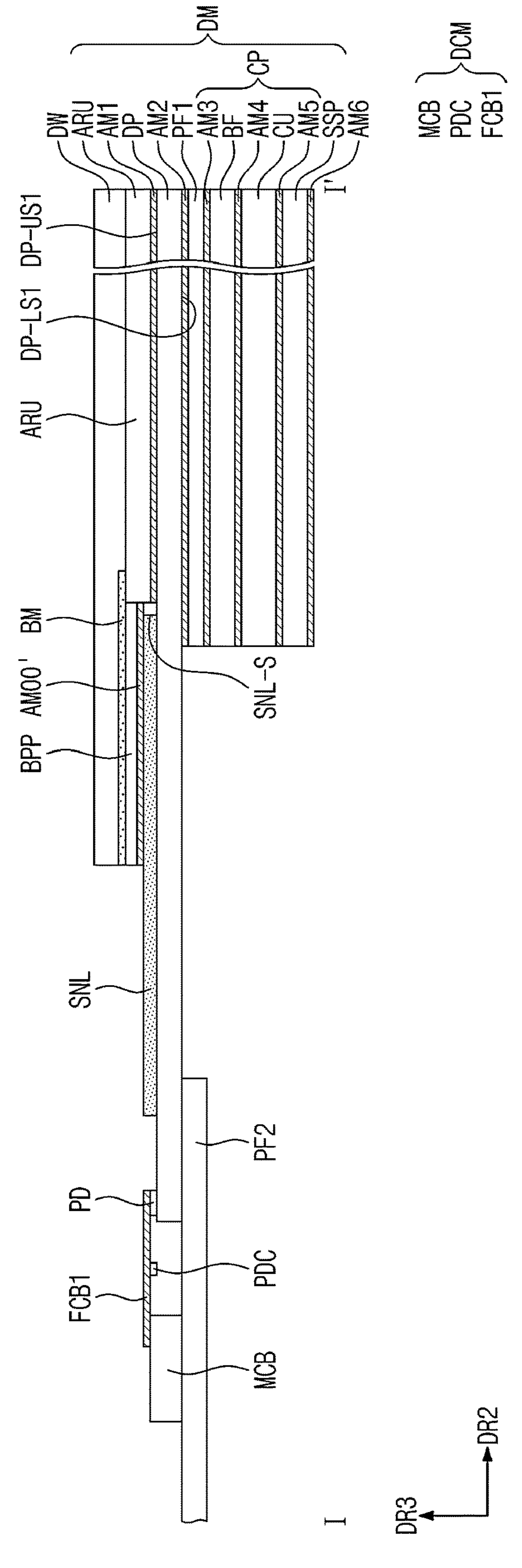
Figure 12D:
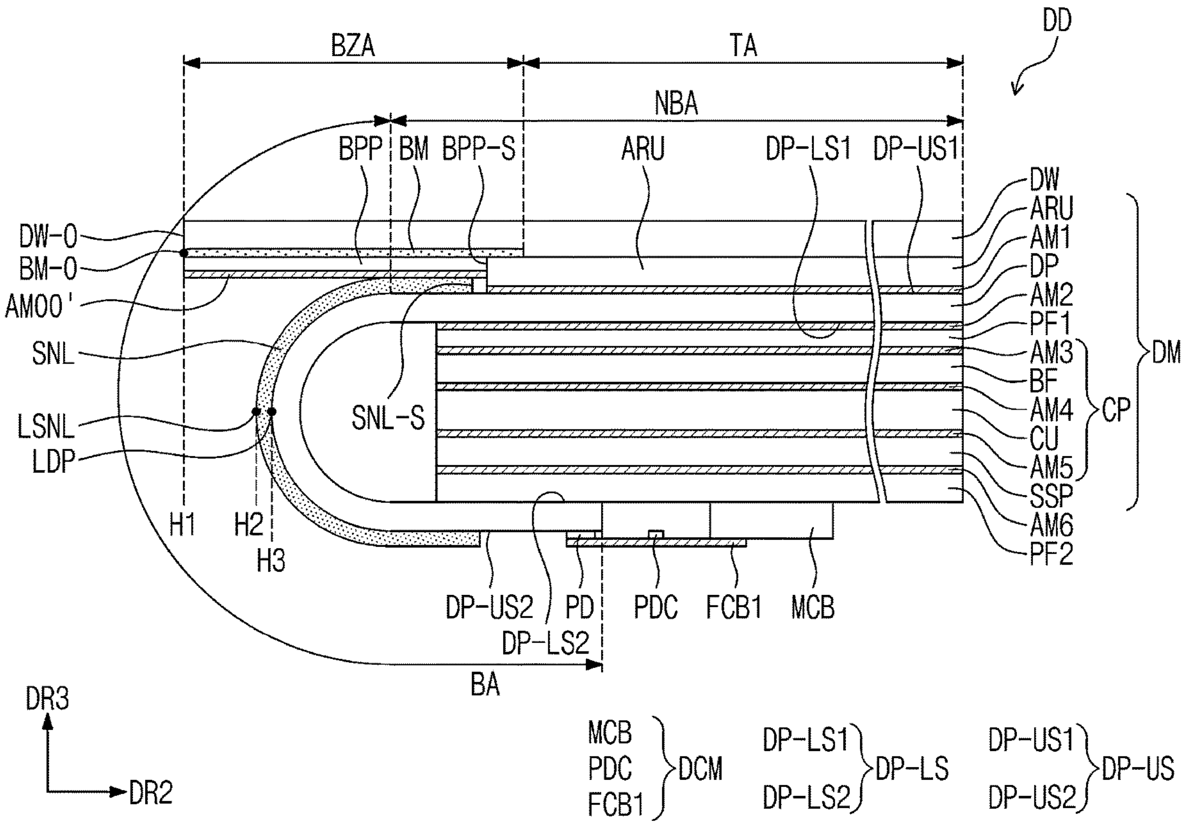

Referring to FIG. 12B, the light shielding pattern BM may be formed directly on the first auxiliary film BPP and the polarization unit ARU. The light shielding pattern BM may include a material cured by laser irradiation. The light shielding pattern BM may be formed by applying a light shielding material onto the first auxiliary film BPP and the polarization unit ARU and curing the applied light shielding material. In such an embodiment, a base plate to which a liquid light shielding material is applied may be used to form the light shielding pattern BM. In such an embodiment, the first auxiliary film BPP and the polarization unit ARU of FIG. 12B may serve as a base plate to which a liquid light shielding material is applied.

Referring to FIG. 12C, the coating window DW may be formed directly on the light shielding pattern BM and the polarization unit ARU. A resin material having light transmittance may be applied onto the light shielding pattern BM and the polarization unit ARU. The coating window DW may be formed by irradiating the applied resin material with a laser beam and curing the applied resin material.

Referring to FIG. 12D, the display panel DP and the bending protection layer SNL may be bent. Accordingly, the second protective film PF2 may be adhered onto the support panel SSP by the sixth adhesive layer AM6. During the bending process, a portion (see FIG. 12C) of the bending protection layer SNL, which is previously adhered to the first auxiliary film BPP by the second lower adhesive layer AM00', may be separated from the first auxiliary film BPP. The second lower adhesive layer AM00' may have a sufficiently small adhesive force so that the bending protection layer SNL is easily separated from the first auxiliary film BPP during the bending process. Accordingly, during the bending process, the shape of the first auxiliary film BPP may not be deformed, and a stress applied to the first auxiliary film BPP may be reduced.

FIGS. 13A to 13D are cross-sectional views illustrating processes of the method of manufacturing the display device DD according to an embodiment of the disclosure. FIGS. 13A to 13D illustrate processes of the method of manufacturing the display device DD (see FIG. 7) illustrated in FIG. 7. Hereinafter, the same reference numerals are used for the same components as those described above with reference to FIG. 7, and any repetitive detailed descriptions thereof will be omitted.

Figure 13A:
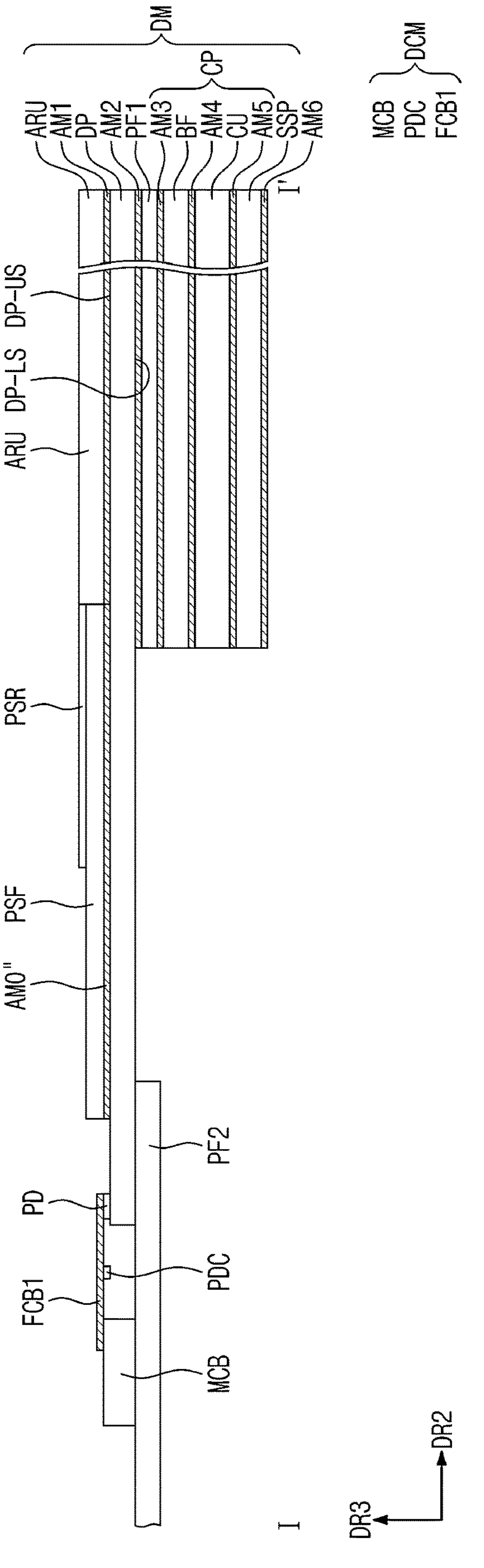
FIGS. 13A to 13D are cross-sectional views illustrating processes of the method of manufacturing the display device according to an embodiment of the disclosure.

Referring to FIG. 13A, in an embodiment of the method of manufacturing the display device DD, the display module DM and the driving control module DCM may be prepared. The display module DM illustrated FIG. 13A is in an unbent state before the display panel DP and the bending protection layer SNL are bent. The polarization unit ARU may be adhered onto the upper surface of the display panel DP by the first adhesive layer AM1. The polarization unit ARU may have a constant thickness and extend in the second direction DR2. The second auxiliary film PSF may be adhered onto the display panel DP by the first lower adhesive layer AM0". The release agent PSR may be coated on the second auxiliary film PSF. The upper surface of the second auxiliary film PSF coated with the release agent PSR and the upper surface of the polarization unit ARU may have a same position in the third direction DR3. The upper surface of the release agent PSR coated on the second auxiliary film PSF and the upper surface of the polarization unit ARU may constitute one plane extending in the second direction DR2.

Figure 13B:
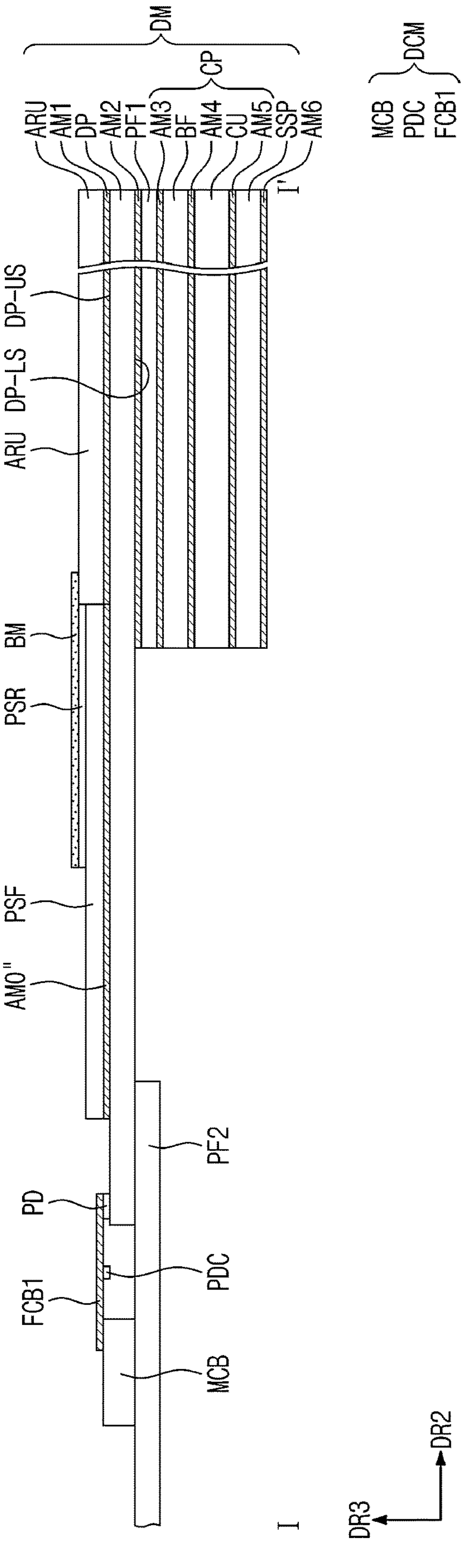

Referring to FIG. 13B, the light shielding pattern BM may be formed directly disposed on the upper surface of the release agent PSR coated on the second auxiliary film PSF and the upper surface of the polarization unit ARU. The light shielding pattern BM may include a material cured by laser irradiation. The light shielding pattern BM may be formed by applying a light shielding material onto the upper surface of the second auxiliary film PSF coated with the release agent PSR and the upper surface of the polarization unit ARU and curing the applied light shielding material. In such an embodiment, a base plate to which a liquid light shielding material is applied may be used to form the light shielding pattern BM. In such an embodiment, the second auxiliary film PSF and the polarization unit ARU of FIG. 13B may serve as a base plate to which a liquid light shielding material is applied.

Figure 13C:
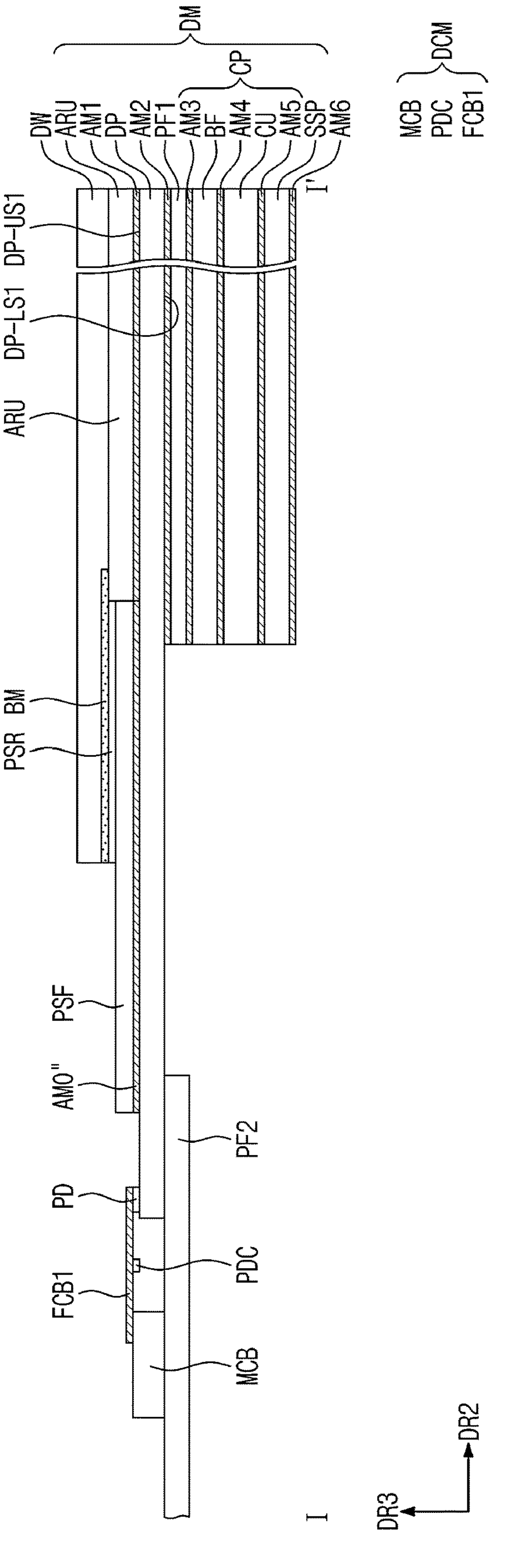

Referring to FIG. 13C, the coating window DW may be formed disposed on the light shielding pattern BM and the polarization unit ARU. A resin material having light transmittance may be applied onto the light shielding pattern BM and the polarization unit ARU. The coating window DW may be formed by irradiating the applied resin material with a laser beam and curing the applied resin material.

Figure 13D:
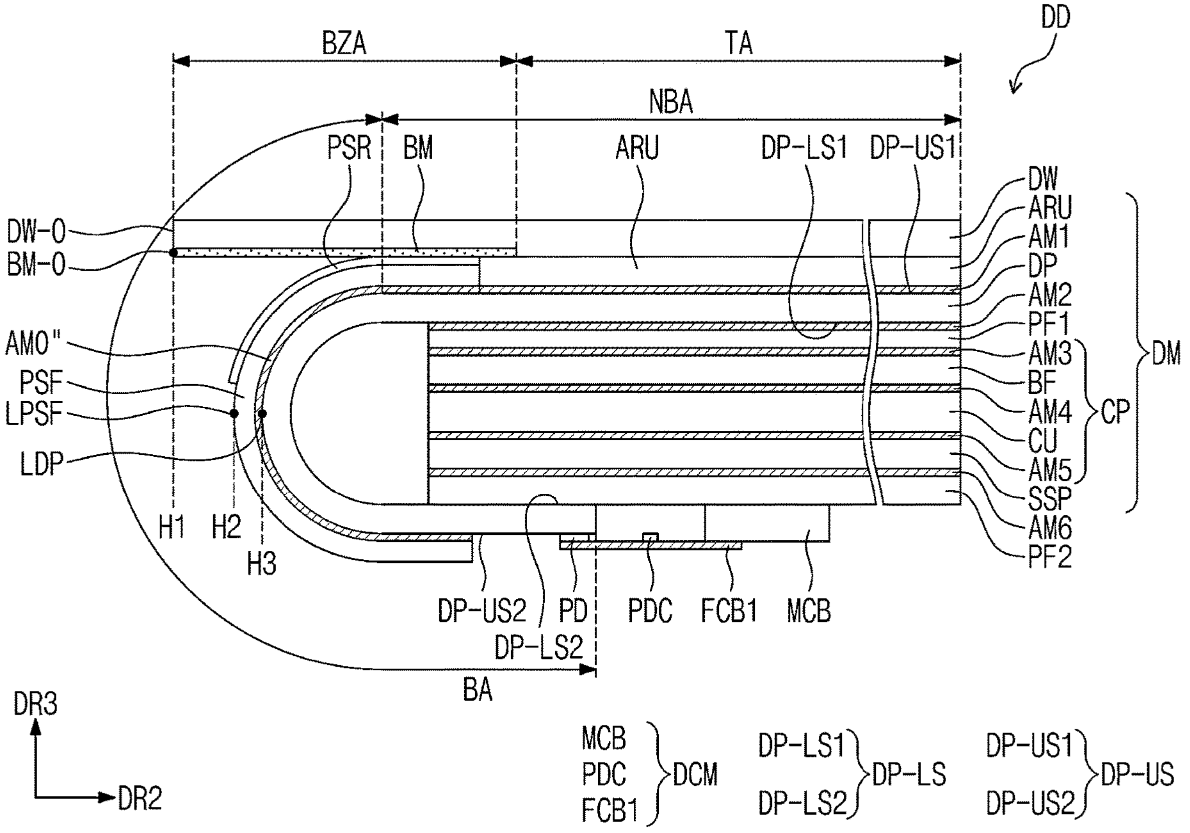

Referring to FIG. 13D, the display panel DP and the second auxiliary film PSF may be bent. Accordingly, the second protective film PF2 may be adhered onto the support panel SSP by the sixth adhesive layer AM6. During the bending process, the second auxiliary film PSF coated with the release agent PSR may be separated from the light shielding pattern BM. Since the release agent PSR is coated between the second auxiliary film PSF and the light shielding pattern BM, during the bending process, the shape of the light shielding pattern BM may not be deformed, and a stress applied to the light shielding pattern BM may be reduced.

FIGS. 14A to 14D are cross-sectional views illustrating processes of the method of manufacturing the display device DD according to an embodiment of the disclosure. FIGS. 14A to 14D illustrate processes of the method of manufacturing the display device DD illustrated in FIG. 8. Hereinafter, the same reference numerals are used for the same components as those described above with reference to FIG. 8, and any repetitive detailed descriptions thereof will be omitted.

Figure 14A:
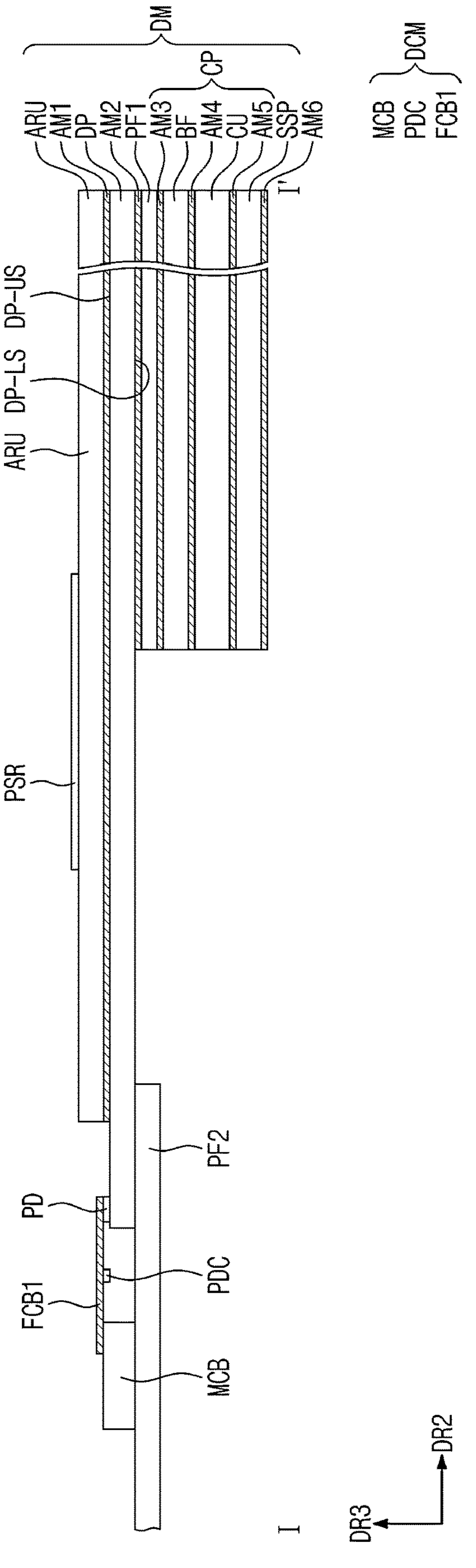
FIGS. 14A to 14D are cross-sectional views illustrating processes of the method of manufacturing the display device according to an embodiment of the disclosure.

Referring to FIG. 14A, in an embodiment of the method of manufacturing the display device DD, the display module DM and the driving control module DCM may be prepared. The display module DM illustrated FIG. 14A is in an unbent state before the display panel DP and the bending protection layer SNL are bent. The polarization unit ARU may be adhered onto the upper surface of the display panel DP by the first adhesive layer AM1. The polarization unit ARU may have a constant thickness and extend in the second direction DR2. One area of the upper surface of the polarization unit ARU may be coated with the release agent PSR.

Figure 14B:
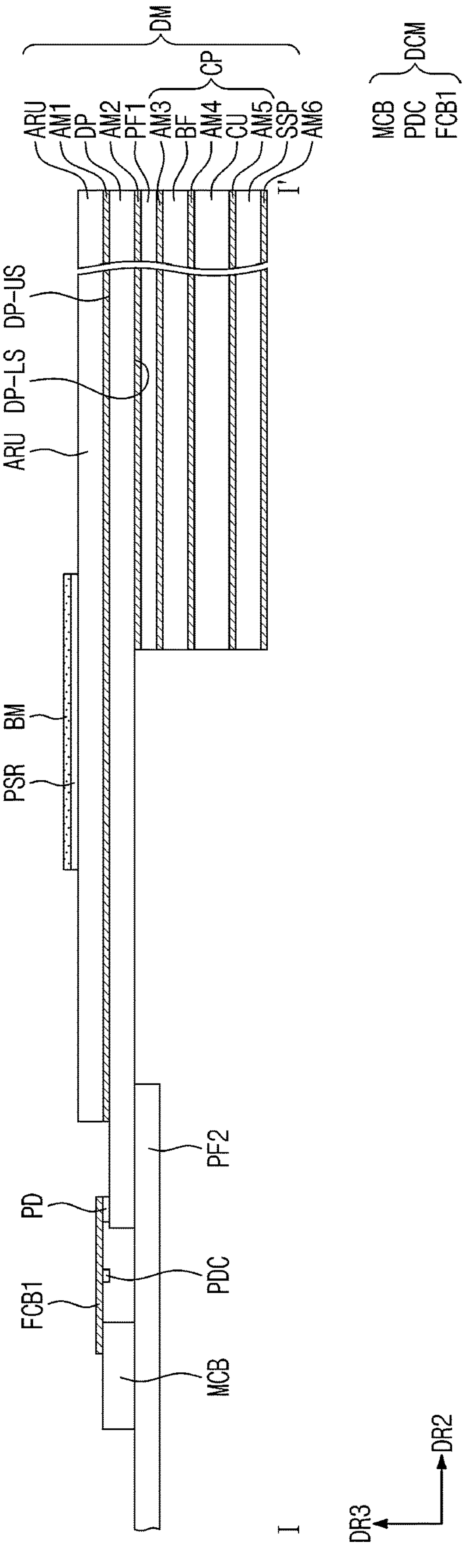

Referring to FIG. 14B, the light shielding pattern BM may be formed directly on the upper surface of the release agent PSR coated on the polarization unit ARU. The light shielding pattern BM may be formed by applying a light shielding material onto the upper surface of the polarization unit ARU to which the release agent PSR is applied and curing the applied light shielding material. An area of the upper surface of the release agent PSR coated on the polarization unit ARU may be an area corresponding to the light shielding pattern BM.

Figure 14C:
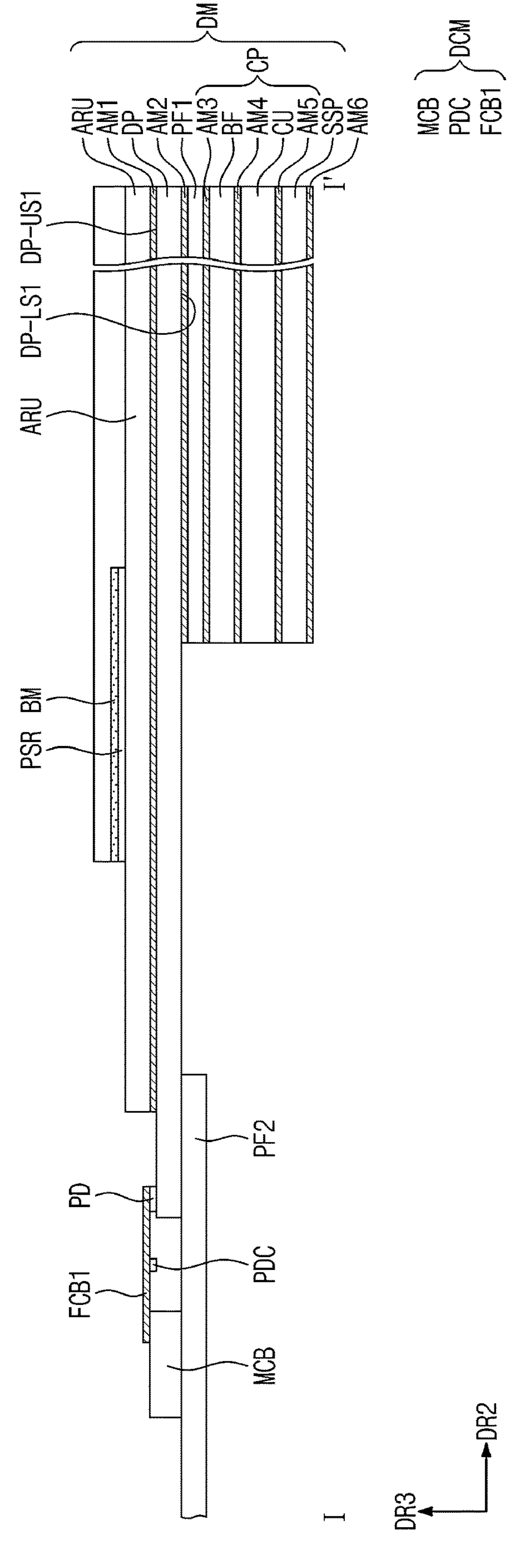

Referring to FIG. 14C, the coating window DW may be formed directly on the light shielding pattern BM and the polarization unit ARU. A resin material having light transmittance may be applied onto the light shielding pattern BM and the polarization unit ARU. The coating window DW may be formed by irradiating the applied resin material with a laser beam and curing the applied resin material.

Figure 14D:
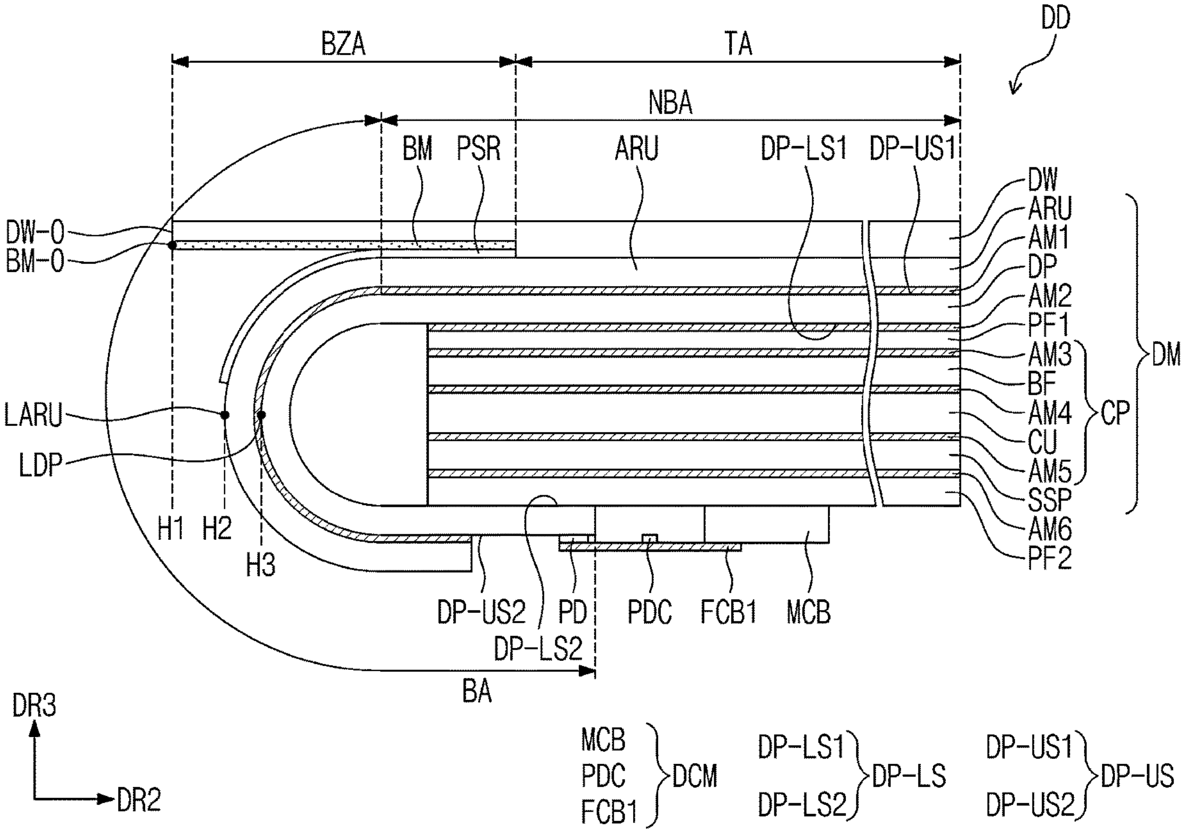

Referring to FIG. 14D, the display panel DP and the polarization unit ARU may be bent. Accordingly, the second protective film PF2 may be adhered onto the support panel SSP by the sixth adhesive layer AM6. During the bending process, the polarization unit ARU coated with the release agent PSR may be separated from the light shielding pattern BM. Since the release agent PSR is coated between the polarization unit ARU and the light shielding pattern BM, during the bending process, the shape of the light shielding pattern BM may not be deformed, and the stress applied to the light shielding pattern BM may be reduced.

In embodiments of a display device according to the disclosure, a coating window is directly disposed on a coating window polarization unit, a light shielding pattern covers a bent portion of a display panel, and thus the bent portion of the display panel may not be visually recognized from the outside.

In embodiments of the display device according to the disclosure, even when the coating window including a resin material and subjected to an applying and curing process is used, the light shielding pattern may extend to cover the bent portion of the display panel.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:

a display panel including a non-bending area and a bending area extending and bent from the non-bending area;

a bending protection layer disposed on the display panel and bent together with the bending area;

a polarization unit disposed on the display panel, overlapping the non-bending area, wherein a step is defined on an upper surface thereof;

a light shielding film adhered to one area of the bending protection layer and the step and covering a bent portion of the display panel in a plan view, wherein the light shielding film is a rigid board; and a coating window disposed directly on the polarization unit and the light shielding film and including a material cured by laser irradiation, wherein the step has a shape corresponding to the light shielding film, and a side surface of the light shielding film is in contact with the step on a cross section.

2. The display device of claim 1, wherein the polarization unit includes a first polarization part having a first thickness and a second polarization part extending from the first polarization part and having a second thickness less than the first thickness.

3. The display device of claim 2, wherein a distance from an upper surface of the second polarization part to a lower surface of the display panel is substantially the same as a distance from an upper surface of the bending protection layer to the lower surface of the display panel.

4. The display device of claim 2, wherein the coating window is disposed directly on an upper surface of the first polarization part, and the light shielding film is adhered onto an upper surface of the second polarization part.

5. The display device of claim 2, wherein an upper surface of the light shielding film and the upper surface of the polarization unit are aligned with each other on the cross section.

6. The display device of claim 1, wherein a lower surface of the light shielding film is adhered to the one area of the bending protection layer by an adhesive layer.

7. The display device of claim 6, wherein the lower surface of the light shielding film is detachably adhered onto the one area of the bending protection layer.

8. The display device of claim 1, wherein an outer surface of the light shielding film and an outer surface of the coating window are aligned with each other on the cross section.

9. The display device of claim 1, wherein an outer surface of the light shielding film protrudes outward beyond a point of a bent portion of the bending protection layer, which is most distant from the non-bending area.

10. A display device comprising:

a display panel including a non-bending area and a bending area extending and bent from the non-bending area;

a polarization unit disposed on the display panel and overlapping the non-bending area;

an auxiliary film disposed to overlap the bending area in a plan view, wherein the auxiliary film has a side surface in contact with an outer surface of the polarization unit and an upper surface extending from an upper surface of the polarization unit;

a light shielding pattern disposed directly on the auxiliary film and the polarization unit and overlapping the bending area in the plan view; and a coating window directly disposed on the light shielding pattern and the polarization unit and including a resin material, wherein a distance from the upper surface of the auxiliary film to a lower surface of the display panel is substantially the same as a distance from the upper surface of the polarization unit to the lower surface of the display panel.

11. The display device of claim 10, further comprising:

a bending protection layer disposed between the display panel and the auxiliary film and bent together with the bending area, wherein an upper surface of the bending protection layer and a lower surface of the auxiliary film are adhered to each other by an adhesive layer.

12. The display device of claim 11, wherein the lower surface of the auxiliary film and the upper surface of the bending protection layer are detachably adhered to each other.

13. The display device of claim 11, wherein an outer surface of the light shielding pattern protrudes outward beyond a point of a bent portion of the bending protection layer, which is most distant from the non-bending area.

14. The display device of claim 10, wherein the auxiliary film is adhered to an upper surface of the display panel and is bent together with the bending area.

15. The display device of claim 14, wherein a portion of the upper surface of the auxiliary film, which corresponds to the light shielding pattern, is coated with a release agent.

16. The display device of claim 15, wherein a sum of a thickness of the auxiliary film and a thickness of the release agent is substantially the same as a thickness of the polarization unit.

17. The display device of claim 14, wherein an outer surface of the light shielding pattern protrudes outward beyond a point of a bent portion of the auxiliary film, which is most distant from the non-bending area.

18. A display device comprising:

a display panel including a non-bending area and a bending area extending and bent from the non-bending area;

a polarization unit disposed on the display panel, bent together with the bending area, and including an upper surface coated with a release agent;

a light shielding pattern disposed directly on the release agent coated on the upper surface and covering a bent portion of the display panel in a plan view; and a coating window disposed directly on the light shielding pattern and the polarization unit and including a resin material.

19. The display device of claim 18, wherein the release agent is coated at only a portion of the upper surface of the polarization unit, which corresponds to the light shielding pattern.

20. The display device of claim 18, wherein an outer surface of the light shielding pattern protrudes outward beyond a point of a bent portion of the polarization unit, which is most distant from the non-bending area.

* * * * *